United States Patent
Kwan

(10) Patent No.: US 8,416,392 B2
(45) Date of Patent: Apr. 9, 2013

(54) OPTICAL IMAGING ARRANGEMENT

(75) Inventor: Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 244 days.

(21) Appl. No.: 12/883,639

(22) Filed: Sep. 16, 2010

(65) Prior Publication Data

US 2011/0001949 A1    Jan. 6, 2011

Related U.S. Application Data

(63) Continuation of application No. 11/947,900, filed on Nov. 30, 2007, which is a continuation of application No. PCT/EP2006/005263, filed on Jun. 2, 2006.

(60) Provisional application No. 60/714,975, filed on Sep. 8, 2005, provisional application No. 60/686,849, filed on Jun. 2, 2005.

(51) Int. Cl.
*G03B 27/54* (2006.01)
*G03B 27/52* (2006.01)

(52) U.S. Cl.
USPC .............................................. 355/67; 355/55

(58) Field of Classification Search ............ 355/67, 355/53, 55, 57; 356/399, 400, 401, 450, 356/500, 843
See application file for complete search history.

(56) References Cited

U.S. PATENT DOCUMENTS

| | | | |
|---|---|---|---|
| 4,758,091 A | 7/1988 | Bodine | |
| 4,790,642 A | 12/1988 | Bruning et al. | |
| 6,031,598 A | 2/2000 | Tichenor et al. | |
| 6,549,270 B1 | 4/2003 | Ota | |
| 6,741,358 B1 | 5/2004 | Kamiya | |
| 7,433,019 B2 | 10/2008 | Kiuchi et al. | |
| 8,120,751 B2 | 2/2012 | Ono et al. | |
| 2002/0080339 A1 | 6/2002 | Takahashi | |
| 2004/0164253 A1 | 8/2004 | Ito | |
| 2004/0263846 A1 | 12/2004 | Kwan | |

FOREIGN PATENT DOCUMENTS

| | | |
|---|---|---|
| EP | 0 502 583 | 9/1992 |
| EP | 1 182 509 | 2/2002 |
| EP | 1 469 348 | 10/2004 |
| EP | 1 503 246 | 2/2005 |

OTHER PUBLICATIONS

International Search Report dated Mar. 20, 2007, for corresponding International Application No. PCT/EP2006/005263, filed on Jun. 2, 2006.

*Primary Examiner* — Peter B Kim
(74) *Attorney, Agent, or Firm* — Fish & Richardson P.C.

(57) ABSTRACT

There is provided an optical imaging arrangement comprising: a mask unit comprising a pattern, a substrate unit comprising a substrate, an optical projection unit comprising a group of optical element units, the optical projection unit being adapted to transfer an image of the pattern onto the substrate, a first imaging arrangement component, the first imaging arrangement component being a component of one of the optical element units, a second imaging arrangement component, the second imaging arrangement component being different from the first imaging arrangement component and being a component of one of the mask unit, the optical projection unit and the substrate unit, and a metrology arrangement. The metrology arrangement captures a spatial relationship between the first imaging arrangement component and the second imaging arrangement component. The metrology arrangement comprises a reference element, the reference element being mechanically connected directly to the first imaging arrangement component.

33 Claims, 8 Drawing Sheets

OPTICAL IMAGING ARRANGEMENT

CROSS-REFERENCE TO RELATED APPLICATIONS

This application is a continuation of U.S. patent application Ser. No. 11/947,900 filed Nov. 30, 2007, which is a continuation of International Application PCT/EP2006/005263, filed Jun. 2, 2006, which claims the benefit under 35 U.S.C. 119(e)(1) of provisional U.S. Patent Application Ser. No. 60/686,849 filed 2 Jun. 2005 and of provisional U.S. Patent Application Ser. No. 60/714,975 filed 8 Sep. 2005, the entire contents of these applications are hereby incorporated herein by reference.

FIELD

The disclosure relates to optical imaging arrangements used in exposure processes, in particular to optical imaging arrangements of microlithography systems. It further relates to a method of capturing a spatial relationship between components of an optical imaging arrangement. It also relates to method of transferring an image of a pattern onto a substrate. Furthermore, it relates to a method of supporting components of an optical projection unit. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices comprise a plurality of optical element units comprising optical elements, such as lenses and mirrors etc., in the light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system.

One approach to achieve enhanced resolution is to reduce the wavelength of the light used in the exposure process. In the recent years, approaches have been made to use light in the extreme ultraviolet (EUV) range using wavelengths down to 13 nm and even below. In this EUV range it is not possible to use common refractive optics any more. This is due to the fact that, in this EUV range, the materials commonly used for refractive optical elements show a degree of absorption that is to high for obtaining high quality exposure results. Thus, in the EUV range, reflective systems comprising reflective elements such as mirrors or the like are used in the exposure process to transfer the image of the pattern formed on the mask onto the substrate, e.g. the wafer.

The transition to the use of high numerical aperture (e.g. NA>0.5) reflective systems in the EUV range leads to considerable challenges with respect to the design of the optical imaging arrangement.

Among others, the above leads to very strict requirements with respect to the relative position between the components participating in the exposure process. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical imaging arrangement components, i.e. the mask, the optical elements and the wafer, for example, cooperating in the exposure process must be supported in a defined manner in order to maintain a predetermined spatial relationship between the optical imaging arrangement components as well to provide a high quality exposure process.

To maintain the predetermined spatial relationship between the optical imaging arrangement components throughout the entire exposure process, even under the influence of vibrations introduced via the ground structure supporting the arrangement and under the influence of thermally induced position alterations, it is necessary to at least intermittently capture the spatial relationship between certain components of the optical imaging arrangement and to adjust the position of at least one of the components of the optical imaging arrangement as a function of the result of this capturing process.

To deal with these problems, in common mainly refractive systems, the optical elements and the metrology devices necessary to capture the spatial relationship mentioned above are substantially rigidly mounted to a so called metrology frame. Such a metrology frame, in general, is a heavy, generally plate shaped body. The metrology frame is supported on the ground structure via vibration isolating mechanism to reduce the influences of vibrations of the ground structure usually lying in the range of about 30 Hz. Furthermore, considerable effort is necessary to avoid thermally induced deformations of the metrology frame. Either the metrology frame has to be made of a generally expensive material with a very low coefficient of thermal expansion or an expensive temperature stabilization system has to be provided. Thus, in any case, the metrology frame is a very complex and, thus, expensive part of the system.

A further problem arising with the use of light in the EUV range lies within the fact that, for a system with a high numerical aperture, at least the mirror closest to the wafer is generally of considerable size by far exceeding the diameter of the last optical elements used in conventional refractive systems. This poses particular problems to the metrology of the wafer stage leveling system providing the position adjustment between the wafer and the optical projection system formed by the optical elements.

In conventional refractive systems, the leveling of the wafer, i.e. the adjustment of the position of the wafer along the optical axis of the optical projection system (often vertical and, thus, often referred to as the z-axis), is often provided using the measurement results of a metrology arrangement mounted to the metrology frame and projecting a beam of light onto the wafer at an oblique angle from a location close to the outer periphery of the last refractive optical element of the projection system. The measurement beam is reflected from the surface of the wafer at an oblique angle as well and hits a receptor element of the metrology arrangement at a location also close to the outer periphery of the last refractive optical element. Depending on the location where the measurement beam hits the receptor element, the location of the wafer with respect to the metrology arrangement may be determined.

In the conventional refractive systems with last refractive optical elements of relatively moderate diameters, reliable high precision measurement results may be achieved. However, due to the large size of the mirror closest to the wafer and the small distance between the mirror and the wafer, in a high numerical aperture EUV systems as outlined above, the angle between the measurement beam and the wafer becomes too small to obtain reliable high precision measurement results.

EP 1 182 509 A2 (by Kwan), the disclosure of which is incorporated herein by reference, discloses an imaging system, wherein the positioning of the mask relative to the optical projection system is provided using the measurement results of a mask metrology arrangement mounted in part to the housing of the projection system and in part to the mask table carrying the mask. Here, the mask table carries the reference elements of the metrology arrangement, i.e. reflectors for interferometry measurements or 2D-gratings for encoder measurements. While this solution eliminates the need for mounting components of the mask metrology arrangement to a metrology frame it still has the disadvantage that parts of the metrology arrangement are mounted to the housing of the optical projection system. Since the housing may be affected by thermally induced expansion effects altering the position of the optical elements received therein, it is necessary to account for these effects when positioning the mask table adding further complexity to the system thus rendered more expensive.

SUMMARY

In some embodiments, the disclosure provides good and long term reliable imaging properties of an optical imaging arrangement used in an exposure process.

In certain embodiments, the disclosure can reduce the effort necessary for an optical imaging arrangement while at least maintaining the imaging accuracy of the optical imaging arrangement used in an exposure process.

The disclosure which is based on the teaching that a reduction of the effort necessary for an optical imaging arrangement while at least maintaining the imaging accuracy of the optical imaging arrangement may be achieved if, on the one hand, at least a part of the metrology system capturing a spatial relationship between components of the optical imaging arrangement, in particular, one or more reference elements of the metrology system, is integrated within or mechanically connected directly to a component of the optical projection unit being adapted to transfer an image of the pattern onto the substrate, and if, on the other hand, certain components of the optical projection unit are arranged so as to receive least a part of the metrology system, in particular, one or more reference elements of the metrology system.

Integration or direct connection of at least parts of the metrology system to a component of the optical projection unit allows to reduce the effort for a metrology frame up to even entirely eliminating the metrology frame. Furthermore, it has turned out that certain components of the optical projection unit may be adapted to be highly suitable for integration or direct connection of at least parts of the metrology system. In particular, it has turned out that certain components of the optical projection unit may be adapted to be highly suitable for integration or direct connection of one or more reference elements of the metrology system.

Thus, according to a first aspect of the disclosure there is provided an optical imaging arrangement comprising: a mask unit comprising a pattern, a substrate unit comprising a substrate, an optical projection unit comprising a group of optical element units, the optical projection unit being adapted to transfer an image of the pattern onto the substrate, a first imaging arrangement component, the first imaging arrangement component being a component of one of the optical element units, a second imaging arrangement component, the second imaging arrangement component being different from the first imaging arrangement component and being a component of one of the mask unit, the optical projection unit and the substrate unit, and a metrology arrangement. The metrology arrangement captures a spatial relationship between the first imaging arrangement component and the second imaging arrangement component. The metrology arrangement comprises a reference element, the reference element being mechanically connected directly to the first imaging arrangement component.

According to a second aspect of the disclosure there is provided an optical imaging arrangement comprising: a mask unit comprising a pattern, a substrate unit comprising a substrate, an optical projection unit comprising a group of optical element units and a support structure. The group of optical element units is adapted to transfer an image of the pattern onto the substrate. The group of optical element units comprises a first sub-group of the optical element units and a first optical element unit separate from the first sub-group. The support structure is supported on a ground structure and supports the first sub-group. The first optical element unit is connected to one of the support structure and the ground structure via a vibration isolating device.

According to a third aspect of the disclosure there is provided an optical imaging arrangement comprising a mask unit comprising a pattern, a substrate unit comprising a substrate and an optical projection unit comprising a group of optical element units and a support structure. The group of optical element units is adapted to transfer an image of the pattern onto the substrate. The optical projection unit comprises a housing unit supporting at least a first sub-group of the optical element units. The housing unit is supported in a vibration isolated manner directly on a ground structure.

According to a fourth aspect of the disclosure there is provided a method of capturing a spatial relationship between a first component and a second component of an optical imaging arrangement. The method comprises: providing an optical imaging arrangement comprising a mask unit comprising a pattern, a substrate unit comprising a substrate; an optical projection unit comprising a group of optical element units, the optical projection unit being adapted to transfer an image of the pattern onto the substrate, a first imaging arrangement component, the first imaging arrangement component being a component of one of the optical element units, a second imaging arrangement component, the second imaging arrangement component being different from the first imaging arrangement component and being a component of one of the mask unit, the optical projection unit and the substrate unit. The method further comprises providing a reference element, the reference element being mechanically connected immediately to the first imaging arrangement component; and capturing a spatial relationship between the first imaging arrangement component and the second imaging arrangement component using the reference element.

According to a fifth aspect of the disclosure there is provided a method of transferring an image of a pattern onto a substrate. The method comprises: in a transferring step, transferring the image of the pattern onto the substrate using an optical imaging arrangement, in a capturing step of the transferring step, capturing a spatial relationship between a first component and a second component of the optical imaging arrangement using the method according to the third aspect of the disclosure; in a controlling step of the transferring step, controlling the position of at least one component of the optical imaging arrangement as a function of the spatial relationship between a first component and a second component captured in the capturing step.

According to a sixth aspect of the disclosure there is provided a method of supporting components of an optical projection unit. The method comprises: providing a group of optical element units, the group of optical element units being adapted to transfer an image of a pattern onto a substrate; providing a housing unit supporting a first sub-group of the optical element units, supporting the housing in a vibration isolated manner directly on a ground structure.

According to a seventh aspect of the disclosure there is provided a method of supporting components of an optical projection unit. The method comprises: providing a group of optical element units, the group of optical element units being adapted to transfer an image of a pattern onto a substrate; supporting a first sub-group of the optical element units via a first support unit, supporting a first optical element unit separately from the first sub-group, the first optical element unit being supported in a vibration isolated manner.

According to an eighth aspect of the disclosure there is provided an optical imaging arrangement comprising: a mask unit comprising a pattern, a substrate unit comprising a substrate, an optical projection unit comprising a group of optical element units, the optical projection unit being adapted to transfer an image of the pattern onto the substrate, a first imaging arrangement component, the first imaging arrangement component being a component of one of the optical element units, a second imaging arrangement component, the second imaging arrangement component being different from the first imaging arrangement component and being a component of one of the mask unit, the optical projection unit and the substrate unit, and a metrology arrangement. The metrology arrangement captures a spatial relationship between the first imaging arrangement component and the second imaging arrangement component. At least one metrology component of the metrology arrangement is integrated into the first imaging arrangement component.

According to a ninth aspect of the disclosure there is provided an optical imaging arrangement comprising a mask unit adapted to receive a pattern, a substrate unit adapted to receive a substrate, an optical projection unit comprising a group of optical element units, the optical projection unit being adapted to transfer an image of the pattern onto the substrate, a first imaging arrangement component, the first imaging arrangement component being a component of the optical projection unit, a second imaging arrangement component, the second imaging arrangement component being a component of one of the mask unit and the substrate unit, a metrology arrangement comprising an encoder arrangement. The metrology arrangement captures a spatial relationship between the first imaging arrangement component and the second imaging arrangement component using the encoder arrangement. The encoder arrangement comprises an emitter, an encoder element and a receiver. The emitter emits a light beam onto the receiver via the encoder element. The encoder element is mechanically connected directly to the first imaging arrangement component.

According to a tenth aspect of the disclosure there is provided a method of capturing a spatial relationship between a first component and a second component of an optical imaging arrangement, the method comprising providing an optical imaging arrangement comprising a mask unit adapted to receive a pattern, a substrate unit adapted to receive a substrate, an optical projection unit comprising a group of optical element units, the optical projection unit being adapted to transfer an image of the pattern onto the substrate, a first imaging arrangement component, the first imaging arrangement component being a component of the optical projection unit, a second imaging arrangement component, the second imaging arrangement component being a component of one of the mask unit and the substrate unit; providing an encoder arrangement comprising an encoder element mechanically connected directly to the first imaging arrangement component; and in a capturing step, capturing a spatial relationship between the first imaging arrangement component and the second imaging arrangement component using the encoder arrangement, the capturing the spatial relationship comprising receiving, via the encoder element, and evaluating at least a part of a light beam emitted towards the encoder element.

According to an eleventh aspect of the disclosure there is provided a method of transferring an image of a pattern onto a substrate, the method comprising, in a transferring step, transferring the image of the pattern onto the substrate using an optical imaging arrangement, in a capturing step of the transferring step, capturing a spatial relationship between a first component and a second component of the optical imaging arrangement using the method according to the disclosure, in a controlling step of the transferring step, controlling the position of at least one component of the optical imaging arrangement as a function of the spatial relationship between a first component and a second component captured in the capturing step.

According to a twelfth aspect of the disclosure there is provided an optical imaging arrangement comprising a mask unit adapted to receive a pattern, a target unit adapted to receive at least one target device, an optical projection unit comprising a group of optical element units, the optical projection unit being adapted to transfer an image of the pattern onto the at least one target device, a first imaging arrangement component, the first imaging arrangement component being a component of one of the optical element units, a second imaging arrangement component, the second imaging arrangement component being different from the first imaging arrangement component and being a component of one of the mask unit, the optical projection unit and the target unit, and a metrology arrangement. The metrology arrangement captures a spatial relationship between the first imaging arrangement component and the second imaging arrangement component. The metrology arrangement comprises a reference element, the reference element being mechanically connected directly to the first imaging arrangement component.

According to a thirteenth aspect of the disclosure there is provided a method of capturing a spatial relationship between a first component and a second component of an optical imaging arrangement. The method comprises providing an optical imaging arrangement comprising a mask unit comprising a pattern, a target unit comprising a target device, an optical projection unit comprising a group of optical element units, the optical projection unit being adapted to transfer an image of the pattern onto the target device, a first imaging arrangement component, the first imaging arrangement component being a component of one of the optical element units, a second imaging arrangement component, the second imaging arrangement component being different from the first imaging arrangement component and being a component of one of the mask unit, the optical projection unit and the target unit, providing a reference element, the reference element being mechanically connected directly to the first imaging arrangement component, and capturing a spatial relationship between the first imaging arrangement component and the second imaging arrangement component using the reference element.

According to a fourteenth aspect of the disclosure there is provided an optical imaging arrangement comprising a mask unit adapted to receive a pattern, a target unit adapted to receive at least one target device, an optical projection unit comprising a group of optical element units, the optical projection unit being adapted to transfer an image of the pattern onto the at least one target device using light in an EUV range. The target unit comprises a substrate unit adapted to receive a substrate forming a first target device and an image sensor unit adapted to receive an image sensor device forming a second target device. The target unit is adapted to selectively place the substrate unit and the image sensor unit into an exposure position relative to the optical projection unit. The image of the pattern is projected onto the substrate received within the substrate unit when the substrate unit is positioned in the exposure position. The image of the pattern is projected onto the image sensor device received within the image sensor unit when the image sensor unit is positioned in the exposure position.

According to a fifteenth aspect of the disclosure there is provided a method of transferring an image of a pattern onto a plurality of target devices. The method comprises selectively placing a substrate forming a first target device and an image sensor device forming a second target device into an exposure position relative to an optical projection unit. In a first transferring step, when the substrate is in the exposure position, the image of the pattern is transferred onto the substrate using the optical imaging arrangement and using light in an EUV range. In a second transferring step, when the image sensor device is in the exposure position, the image of the pattern is transferred onto the image sensor device using the optical imaging arrangement and using light in an EUV range.

Further aspects and embodiments of the disclosure will become apparent from the dependent claims and the following description of embodiments which refers to the appended figures. All combinations of the features disclosed, whether explicitly recited in the claims or not, are within the scope of the disclosure.

DETAILED DESCRIPTION

In the following, an optical imaging arrangement 1 according to the disclosure with which embodiments of methods according to the disclosure may be executed will be described with reference to FIGS. 1 and 2.

Figure 1:
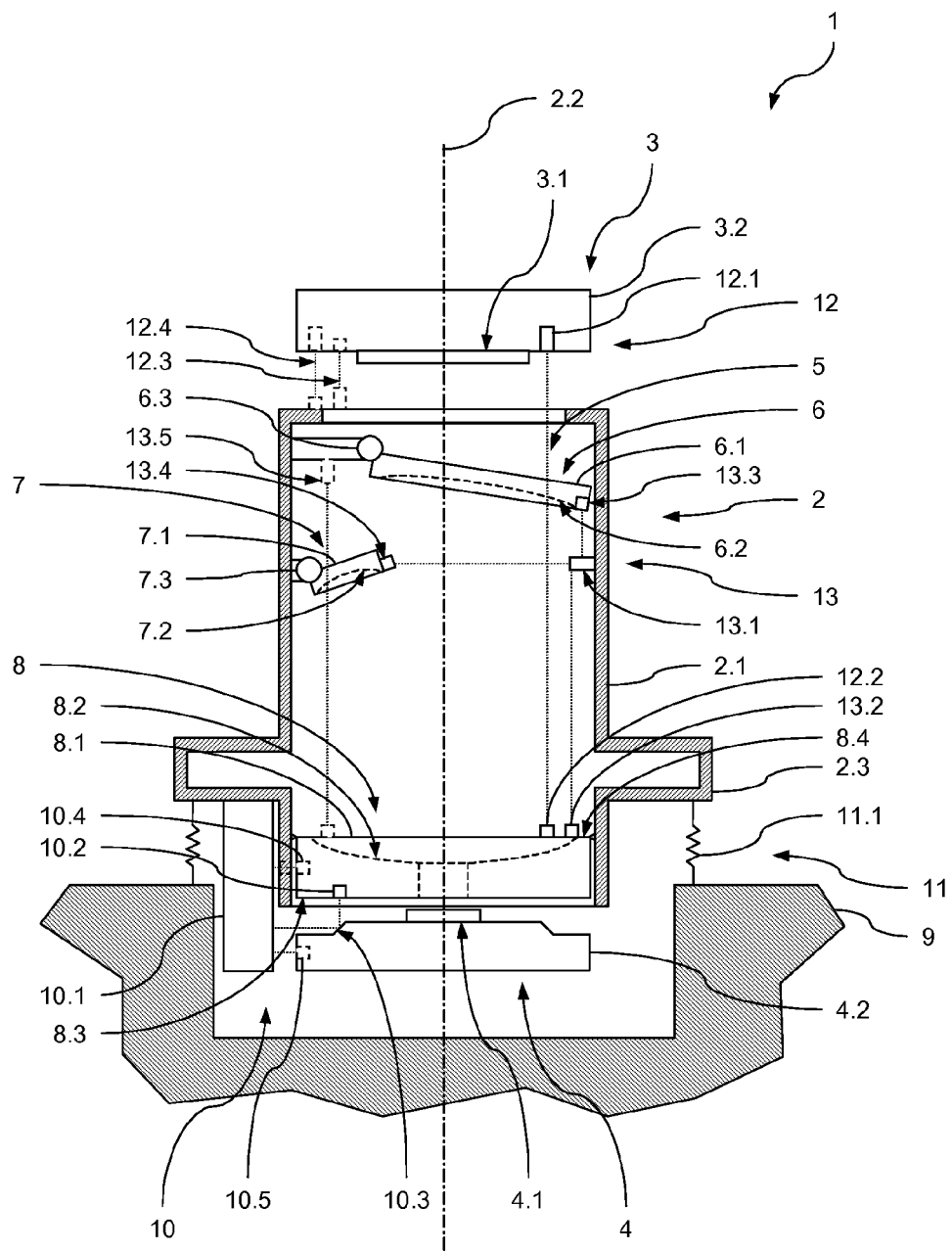
FIG. 1 is a schematic representation of an optical imaging arrangement according to the disclosure with which embodiments of methods according to the disclosure may be executed.
Figure 2:
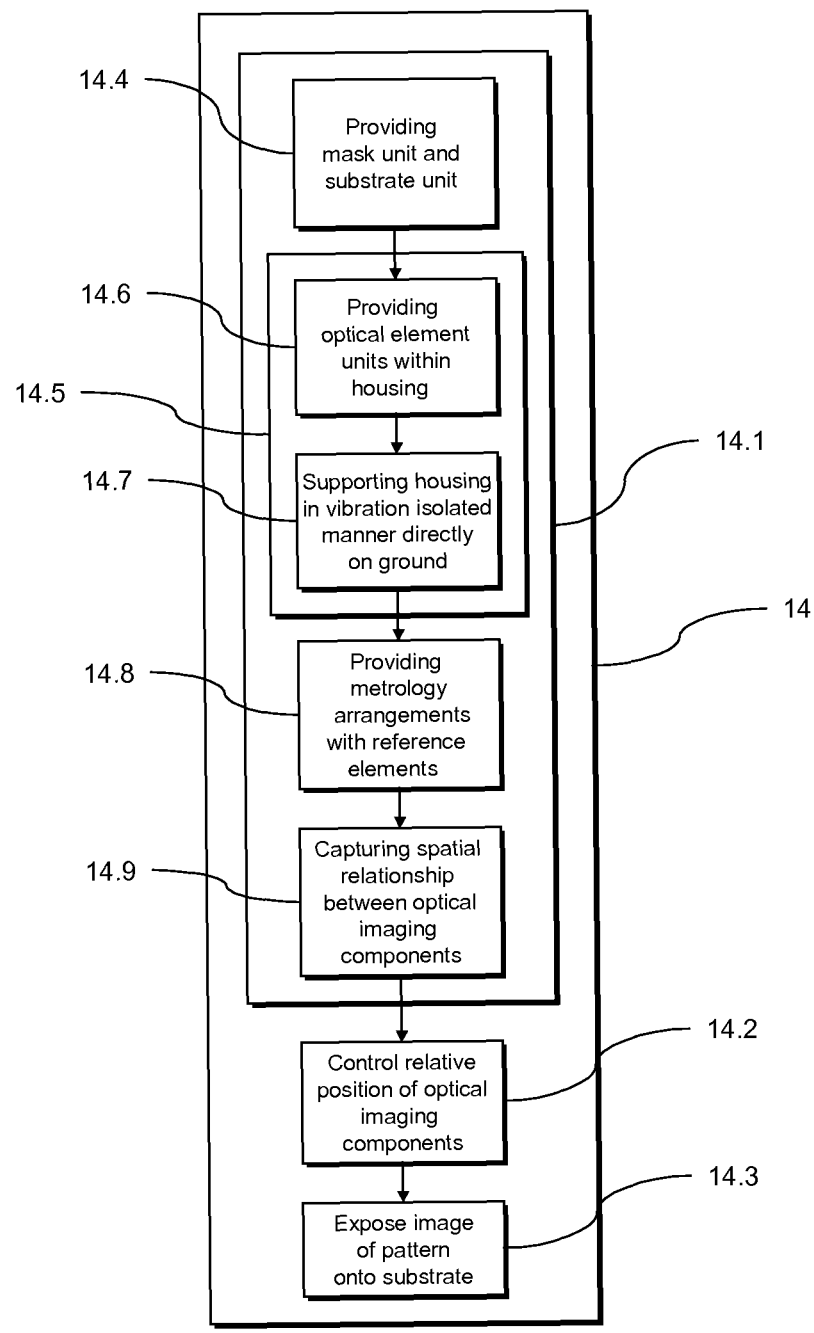
FIG. 2 is a block diagram of a method of transferring an image of a pattern onto a substrate according to the disclosure which may be executed with the optical imaging arrangement of FIG. 1.

FIG. 1 is a schematic and not-to-scale representation of the optical imaging arrangement in the form of an optical exposure apparatus 1 operating in the EUV range at a wavelength of 13 nm. The optical exposure apparatus 1 comprises an optical projection unit 2 adapted to transfer an image of a pattern formed on a mask 3.1 of a mask unit 3 onto a substrate 4.1 of a substrate unit 4. To this end, the optical exposure apparatus 1 comprises an illumination system—not shown—illuminating the reflective mask 3. The optical exposure unit 3 receives the light reflected from the mask 3.1 and projects the image of the pattern formed on the mask 3.1 onto the substrate 4.1, e.g. a wafer or the like.

To this end, the optical projection unit 2 holds an optical element unit group 5 of optical element units. This optical element unit group 5 is held within a housing 2.1 of the optical projection unit 2, often also referred to as the projection optics box (POB) 2.1. The optical element unit group 5 comprises a number of optical elements in the form of mirrors, of which only the mirrors 6.1, 7.1, 8.1 are shown. These optical elements 6.1, 7.1, 8.1 are positioned with respect to one another along an axis 2.2 of the optical projection unit 2 in up to all 6 degrees of freedom.

The optical projection unit 2 receives the part of the light path between the mask 3.1 and the substrate 4.1. The projection surfaces 6.2, 7.2, 8.2 of its optical elements 6.1, 7.1, 8.1 cooperate to transfer the image of the pattern formed on the mask 4 onto the substrate 5 located at the end of the light path.

The mask 3.1 is received on a mask table 3.2 of the mask unit 3, the mask table 3.2 being supported by a suitable support structure—not shown—on a ground structure 9. In a similar way, the substrate 4.1 is received on a substrate table 4.2 of the substrate unit 4, the substrate table 4.2 as well being supported by a suitable support structure—not shown—on the ground structure 9.

The image of the pattern formed on the mask 3.1 is usually reduced in size and transferred to several target areas of the substrate 4.1. The image of the pattern formed on the mask 3.1 may be transferred to the respective target area on the substrate 4.1 in two different ways depending on the design of the optical exposure apparatus 1. If the optical exposure apparatus 1 is designed as a so called wafer stepper apparatus, the entire image of the pattern is transferred to the respective target area on the substrate 4.1 in one single step by irradiating the entire pattern formed on the mask 3.1. If the optical exposure apparatus 1 is designed as a so called step-and-scan apparatus, the image of the pattern is transferred to the respective target area on the substrate 4.1 by progressively scanning the mask table 3.2 and thus the pattern formed on the mask 3.1 under the projection beam while performing a corresponding scanning movement of the substrate table 4.2 and, thus, of the substrate 4.1 at the same time.

In both cases, the relative position of the optical elements of optical element unit group 5, i.e. the mirrors 6.1, 7.1, 8.1, with respect to each other as well as with respect to the mask 3.1 and with respect to the substrate 4.1 has to be maintained within predetermined limits to obtain a high quality imaging result.

During operation of the optical exposure apparatus 1, the relative position of the mirrors 6.1, 7.1, 8.1 with respect to each other as well as with respect to the mask 3.1 and the substrate 4.1 is subject to alterations resulting from, both, intrinsic and extrinsic, disturbances introduced into the system. Such disturbances may be mechanical disturbances, e.g. in the form vibrations resulting from forces generated within the system itself but also introduced via the surroundings of the system, e.g. the ground structure 9. They may also thermally induced disturbances, e.g. position alterations due to thermal expansion of the parts of the system.

In order to keep the above predetermined limits of the relative position of the mirrors 6.1, 7.1, 8.1 with respect to each other as well as with respect to the mask 3.1 and the substrate 4.1, the mirrors 6.1 and 7.1 may be actively positioned in space via actuator units 6.3 and 7.3, respectively. Similarly, the mask table 3.2 and the substrate table 4.2 may be actively positioned in space via the respective support structure (not shown in FIG. 1).

The active positioning of these parts is performed on the basis of the measurement results of a plurality of metrology arrangements capturing the spatial relationship between certain components of the optical exposure apparatus 1.

A first metrology arrangement 10, in 6 degrees of freedom (DOF), captures the spatial relationship between a first imaging arrangement component of the optical exposure apparatus 1 and a second imaging arrangement component of the optical exposure apparatus 1 different from the first imaging arrangement component.

The first imaging arrangement component is a first optical element in the form of the first mirror 8.1 located closest to the substrate 4.1. Thus, the first imaging arrangement component is a component of the optical element unit 8. The second imaging arrangement component is the substrate table 4.2, i.e. a component of the substrate unit 4. Since the spatial relationship between the substrate table 4.2 and the substrate 4.1 is known, e.g. due to a measurement operation immediately preceding the exposure process, the first metrology arrangement 10 also allows to capture the spatial relationship between the substrate 4.1, as a component of the substrate unit 4, and the first mirror 8.1.

The metrology arrangement 10 and all further metrology arrangements described herein in the following operate in a contactless manner by using metrology light beams indicated in the appended Figures by dotted lines. However, it will be appreciated that, with other embodiments of the disclosure, any suitable contact based metrology arrangement may be used as well. In particular, the choice of the working principle may be made as a function of the accuracy requirements. As contactless working principles interferometric, encoder based, capacitive or inductive working principles etc. may be used for example. As contact based working principles magneto-strictive or electrostrictive working principles etc. may be used for example.

The first metrology arrangement 10 comprises at least a first emitter and receiver unit 10.1 connected to the housing 2.1. The metrology arrangement 10 further comprises a first reference element 10.2 being mechanically connected directly to the first mirror 8.1, i.e. to the first imaging arrangement component.

The term "mechanically connected directly", in the sense of the disclosure, is to be understood as a direct connection between two parts including—if any—a short distance between the parts allowing to reliably determine the position of the one part by measuring the position of the other part. In particular, the term may mean without the interposition of further parts introducing uncertainties in the position determination, e.g. due to thermal or vibration effects.

The first reference element 10.2 is connected to the back side surface 8.3 of the first mirror 8.1 opposite to the first reflective surface 8.2 of the first mirror 8.1. Depending on the working principle of the first metrology arrangement 10, the first reference element may be a reflecting element, e.g. a reflective surface or an element providing a plurality of reflecting surfaces such as a so called corner cube prism or the like, when an interferometry principle is used or a diffractive element, e.g. a grating, when an encoder principle is used. In FIG. 1, the reference element 10.2 is formed by the back side surface 8.3 of the first mirror 8.1. To this end, depending on the working principle of the first metrology arrangement 10, the back side surface 8.3 of the first mirror, at least in the region of the reference element 10.2, may be executed as a reflective surface or may show a grating, e.g. a grating directly exposed onto the back side surface 8.3.

However, it will be appreciated that, with other embodiments of the disclosure, the first reference element may also be an element separate from the first mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

The first mirror 8.1, depending on the optical design of the optical system of the optical projection unit 2, typically, has a diameter of about 200 to 800 mm while the substrate 4.1, typically, has a diameter of about 50 to 450 mm. Thus, in the most extreme case, the first mirror 8.1 has a diameter that is 16 times the diameter of the substrate, leading to a situation as mentioned above wherein the conventional leveling systems mentioned initially may not be used anymore.

This problem is overcome by the disclosure by connecting, more precisely, integrating the first reference within the first mirror 8.1 located closest to the substrate 4.1 and by projecting the measurement beam of the first metrology arrangement 10 from a lateral position in a plane substantially perpendicular to the axis 2.2, i.e. here in a substantially horizontal plane, onto a reflector surface 10.3 of the first metrology arrangement 10. The reflector surface 10.3 directs the measurement beam onto the first reference element 10.2. The reflector surface 10.3 is formed on a surface of the substrate table 4.2 that, with a properly aligned substrate table 4.2, is inclined by 45° with respect to the axis 2.2. With such an arrangement, independent of the diameter correlations between the first mirror 8.1 and the substrate 4.1, a reliable measurement of the distance between the first mirror 8.1 and the substrate table 4.2 (and thus the substrate 4.1) along the axis 2.2 may be made.

It will be appreciated that the measurement of the relative position between the first mirror 8.1 and the substrate table 4.2 in all six degrees of freedom may be made using one or more measurement beams directed onto the reflector surface 10.3. In this case, for example, interferometry and encoder principles may be combined leading to a combination of reflective surfaces and gratings on the back side surface 8.3 of the first mirror 8.1. However, it will be appreciated that, with other embodiments of the disclosure, further reference elements located at other locations than the back side surface 8.3 of the first mirror may be used in the first metrology arrangement as it is indicated in FIG. 1 by the dashed contours 10.4 and 10.5.

Connection, more precisely integration, of part of the first metrology arrangement 10 with the first mirror 8.1 results in a gain in building space which, in turn, allows to connect the remaining parts of the first metrology arrangement 10, in particular the first emitter and receiver unit 10.1, directly to the housing 2.1 without the interposition of a large and bulky structure such as a metrology frame or the like.

Thus, the metrology frame as it is used in conventional systems is omitted and the housing 2.1 of the optical projection unit 2 integrates the function of such a metrology frame and is directly connected to the ground structure 9 in a vibration isolated manner via a vibration isolating device 11. The vibration isolating device 11, at its upper first end, directly contacts the housing 2.1 at a flange part 2.3 of the housing 2.1 and, at its lower second end, directly contacts the ground structure 9.

The vibration isolating device 11 is formed by a plurality of vibration isolating units 11.1 evenly distributed at the circumference of the housing 2.1. The frequency of the external mechanical disturbances introduced into the optical projection unit 2 via the ground structure 9 typically ranges between 30 Hz down to 1 Hz. Thus, depending on the frequency of the mechanical disturbances to be expected, the vibration isolating units 11.1 may be of any suitable type providing a support to the housing 2.1 at a resonant frequency of at least a factor 10 below the frequency of the mechanical disturbances to be expected.

Typically, the resonant frequency of the vibration isolating units 11.1 will be chosen between 0.01 and 10 Hz. The resonant frequency of the support provided by the vibration isolating units 11.1 can be at about 0.1 Hz or below. Such a vibration isolating unit 11.1 may be provided by well known so called magnetic gravity compensators as they are disclosed in WO 2005/028601 A2 (Muhlbeyer et al.), the disclosure of which is incorporated herein by reference, having lateral drift control which may also operate according to an electromagnetic principle (e.g. using voice coil motors etc.) and may also provide the drift control at a resonant frequency of about the same order, such as about 0.1 Hz or below.

However, it will be appreciated that, with other embodiments of the disclosure, other working principles, e.g. purely mechanical working principles with spring arrangements or pneumatic arrangements of suitably low resonant frequency, may be chosen for the vibration isolating units.

The elimination of the conventional metrology frame that may be achieved according to the disclosure provides a number of advantages over the optical projection systems currently known:

One advantage is that the elimination of the conventional metrology frame frees up a considerable amount of building space close to the substrate. This facilitates the design and dimensioning of the projection optics. A further advantage is that the housing 2.1 of the optical projection unit in itself has already to be highly stabilized in terms of thermal stability in order to reduce thermal drift effects between the optical elements received therein. Thus, the housing 2.1 is particularly suitable for integrating parts of the first metrology arrangement and the considerable effort usually necessary for thermal stabilization of a metrology frame has not to be taken. This considerably reduces the overall costs of the optical projection apparatus 1.

The first mirror 8.1 serves as the central reference in the entire system. Thus, a second metrology arrangement 12 is provided capturing the spatial relationship between the first mirror 8.1 and the mask table 3.2 in order to use the result in positional adjustment of the mask table 3.2 with respect to the optical projection system.

The second metrology arrangement 12 comprises a second emitter and receiver unit 12.1 connected to the mask table 3.2 and a second reference element 12.2 mechanically directly connected to the front side surface 8.4 of the first mirror 8.1. Here again, the second metrology arrangement 12 may capture, in 6 degrees of freedom (DOF), the spatial relationship between the first mirror 8.1 as a first imaging arrangement component of the optical exposure apparatus 1 and the mask table 3.2 as a second imaging arrangement component of the optical exposure apparatus 1.

The second reference element 12.2 is connected to the front side surface 8.3 of the first mirror 8.1 also forming the first reflective surface 8.2 of the first mirror 8.1. Depending on the working principle of the second metrology arrangement 12, the second reference element may be a reflecting element, e.g. a reflective surface or an element providing a plurality of reflecting surfaces such as a so called corner cube prism or the like, when an interferometry principle is used, or a diffractive element, e.g. a grating, when an encoder principle is used.

In FIG. 1, the front side surface 8.4 of the first mirror 8.1, depending on the working principle of the second metrology arrangement 12, at least in the region of the second reference element 12.2, may be executed as a reflective surface or may show a grating, e.g. a grating directly exposed onto the front side surface 8.4.

However, it will be appreciated that, with other embodiments of the disclosure, the second reference element may also be an element separate from the first mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

Furthermore, it will be appreciated that, with other embodiments of the disclosure, the second metrology arrangement 12 may be replaced by a conventional metrology arrangement as it is known from EP 1 182 509 A2 and as it is indicated in FIG. 1 by the dashed contour 12.3. Furthermore, the second metrology arrangement 12 may also be replaced by a metrology arrangement as it is indicated in FIG. 1 by the dashed contour 12.4. With such a second metrology arrangement the emitter and receiver unit is again connected to the mask table 3.2 and the second reference element is mechanically directly connected to the housing 2.1.

Finally, a third metrology arrangement 13 is provided capturing the spatial relationship between the first mirror 8.1 and the other mirrors 6.1 and 7.1 in order to use the result in the positional adjustment of the other mirrors 6.1 and 7.1 with respect to the first mirror 8.1.

The third metrology arrangement 13 comprises a third emitter and receiver unit 13.1 connected to the housing 2.1 and third reference elements 13.2, 13.3, 13.4 mechanically directly connected to surfaces of the mirrors 8.1, 6.1 and 7.1, respectively. Here again, the third metrology arrangement 13 may capture, in 6 degrees of freedom (DOF), the spatial relationship between the first mirror 8.1 as a first imaging arrangement component of the optical exposure apparatus 1 and the respective mirror 6.1 and 7.1 as a second imaging arrangement component of the optical exposure apparatus 1.

The third reference elements 13.2, 13.3, 13.4, depending on the working principle of the third metrology arrangement 13, may be reflecting elements, e.g. reflective surfaces or elements providing a plurality of reflecting surfaces such as a so called corner cube prism or the like, when an interferometry principle is used, or diffractive elements, e.g. gratings, when an encoder principle is used. In FIG. 1, the respective surfaces of the mirrors 8.1, 6.1 and 7.1 forming the third reference elements, depending on the working principle of the third metrology arrangement 13, at least in the region of the respective third reference element 13.2, 13.3, 13.4, may be executed as a reflective surface or may show a grating, e.g. a 2D grating.

However, it will be appreciated that, with other embodiments of the disclosure, the respective third reference element may also be an element separate from the respective mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

Furthermore, it will be appreciated that the respective measurement beam of the respective metrology arrangement does not necessarily have to have a straight path as it is shown in FIG. 1. Rather, depending on the design of the optical system, appropriate beam steering optics may be provided to guide the respective measurement beam, in a defined manner, on a folded path.

Furthermore, it will be appreciated that, with other embodiments of the disclosure, the third metrology arrangement 13 may be replaced by separate metrology arrangements as separately capturing the spatial relationship between the first mirror and the respective further mirror as it is indicated in FIG. 1 by the dashed contour 13.5.

The first to third reference elements 10.2, 12.2, 13.2, 13.3, 13.4 have been provided directly on the respective optical element, i.e. mirrors 6.1, 7.1, 8.1. However, it will be appreciated that, with other embodiments of the disclosure, the respective reference elements may also be connected to other components of the respective optical element unit allowing for proper assessment of the spatial position of the respective optical element. For example, the respective reference element may also be connected to a optical element mounting holding the respective optical element and displaced together with the respective optical element.

The above mentioned metrology systems 10, 12, 13 could be such that they measure the direct spatial relationship between mirror 8.1, the substrate table 4.1, the mask table 3.1, and the mirrors 6.1 and 7.1. Alternatively, the spatial measurement can also be implemented indirectly, e.g. by measuring the positions of the individual elements relative to a stable reference structure (e.g. structure 2.1), from which the direct spatial relationship between any 2 of the elements could be determined by vector addition.

With the optical exposure apparatus 1 of FIG. 1 a method of transferring an image of a pattern onto a substrate according to the disclosure may be executed as it will be described in the following with reference to FIGS. 1 and 2.

In a transferring step 14 of this method, an image of the pattern formed on the mask 3.1 is transferred onto the substrate 4.1 using the optical projection unit 2 of the optical imaging arrangement 1.

To this end, in a capturing step 14.1 of the transferring step 14, the spatial relationship between the first mirror 8.1 as a first component of the optical imaging arrangement 1 and the substrate table 4.2, the mask table 3.2 and the other mirrors 6.1 and 7.1 each forming a second component of the optical imaging arrangement 1 is captured using the method of capturing a spatial relationship between a first component and a second component of an optical imaging arrangement 1 according to the disclosure.

In a controlling step 14.2 of the transferring step, the position of the substrate table 4.2, the mask table 3.2 and the other mirrors 6.1 and 7.1 with respect to the first mirror 8.1 is controlled as a function of the spatial relationship previously captured in the capturing step 14.1. In an exposure step 14.3, immediately following or eventually overlapping the controlling step 14.2, the image of the pattern formed on the mask 3.1 is then exposed onto the substrate 4.1 using the optical imaging arrangement 1.

In a step 14.4 of the capturing step 14.1, the mask unit 3 with the mask 3.1 and the substrate unit 4 with the substrate 4.1 is provided and positioned in space. It will be appreciated that the mask 3.1 and the substrate 4.1 may also be inserted into the mask unit 3 and the substrate unit 4, respectively, at a later point in time prior to the actual position capturing or at an even later point in time prior to the exposure step 14.3.

In a step 14.5 of the capturing step 14.1, the components of the optical projection unit 2 are provided and supported according to a method of supporting components of an optical projection unit according to the disclosure. To this end, in a step 14.6, the optical element units 6, 7, 8 of the optical projection unit 2 are provided and positioned within the housing 2.1 of the optical projection unit 2. In a step 14.7, the housing 2.1 with the optical element units 6, 7, 8 is supported in a vibration isolated manner on the ground structure 9 to provide a configuration as it has been described above in the context of FIG. 1.

In a step 14.8 of the capturing step 14.1 the first to third metrology arrangements 10, 12, 13 are provided to provide a configuration as it has been described above in the context of FIG. 1. It will be appreciated that the first to third reference elements 10.2, 12.2, 13.2, 13.3, 13.4 have already been provided at an earlier point in time together with the respective mirror 6.1, 7.1, 8.1 on which they are formed. However, with other embodiments of the disclosure, the first to third reference elements may be provided together with the other components of the first to third metrology arrangement at a later point in time prior to the actual position capturing.

In a step 14.9 of the capturing step 14.1, the actual spatial relationship between the first mirror 8.1 as a first component of the optical imaging arrangement 1 and the substrate table 4.2, the mask table 3.2 and the other mirrors 6.1 and 7.1 each forming a second component of the optical imaging arrangement 1 is then captured.

It will be appreciated that the actual spatial relationship between the first mirror 8.1 as a first component of the optical imaging arrangement 1 and the substrate table 4.2, the mask table 3.2 and the other mirrors 6.1 and 7.1 each forming a second component of the optical imaging arrangement 1 may be captured continuously throughout the entire exposure process. In the step 14.9, the most recent result of this continuous capturing process is then retrieved and used.

As described above, in the controlling step 14.2, the position of the substrate table 4.2, the mask table 3.2 and the other mirrors 6.1 and 7.1 with respect to the first mirror 8.1 is then controlled as a function of this spatial relationship previously captured before, in the exposure step 14.3, the image of the pattern formed on the mask 3.1 is exposed onto the substrate 4.1.

An optical imaging arrangement 101 according to the disclosure with which embodiments of methods according to the disclosure may be executed will be described with reference to FIG. 3.

Figure 3:
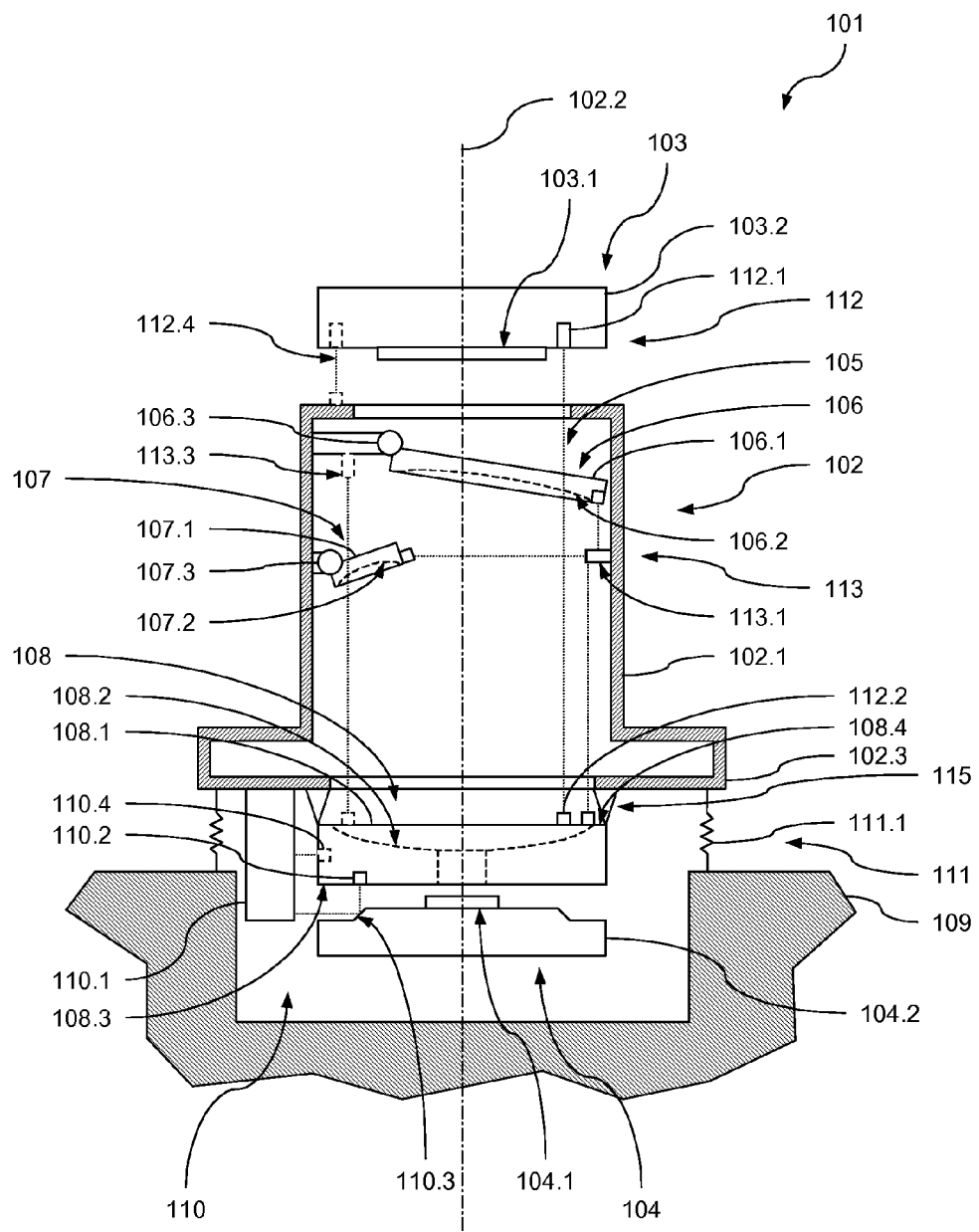
FIG. 3 is a schematic representation of an optical imaging arrangement according to the disclosure with which embodiments of the methods according to the disclosure may be executed.

FIG. 3 is a schematic and not-to-scale representation of the optical imaging arrangement in the form of an optical exposure apparatus 101 operating in the EUV range at a wavelength of 13 nm. The optical exposure apparatus 101 comprises an optical projection unit 102 adapted to transfer an image of a pattern formed on a mask 103.1 of a mask unit 103 onto a substrate 104.1 of a substrate unit 104. To this end, the optical exposure apparatus 101 comprises an illumination system—not shown—illuminating the reflective mask 103. The optical exposure unit 103 receives the light reflected from the mask 103.1 and projects the image of the pattern formed on the mask 103.1 onto the substrate 104.1, e.g. a wafer or the like.

FIG. 3, in its design and functionality, largely corresponds to FIG. 1. In particular, in FIG. 3, like or identical parts have been given the same reference numeral raised by 100. Thus, it is here mainly referred to the explanations given above and, primarily, only the differences will be discussed.

The main difference lies within the fact that the first mirror 108.1 located closest to the substrate 104.1 is not located within the housing 102.1 of the optical projection unit 102, often also referred to as the projection optics box (POB) 102.1. Instead, the first mirror 108.1 is suspended to the lower part of the housing 102.1 by a substantially rigid mounting device 115 providing support to the first mirror 108.1 at a resonant frequency of about 300 Hz.

Apart from the elimination of a conventional metrology frame, FIG. 3 has the advantage that, due to the substantially rigid suspension of the first mirror 108.1 outside the housing 102.1, building space becomes available in the region of the first mirror 108.1, since no housing elements are located at the circumference of the first mirror 108.1. Thus, the components of the first metrology arrangement 110 mounted to the housing 102.1 may be located closer to the first mirror 108.1 leading to improved dynamic behavior of these components.

It will be appreciated that, with FIG. 3 as well, the methods according to the disclosure as they have been described above with reference to FIG. 2 may be executed as well. Thus, in this context, it is here only referred to the above explanations.

An optical imaging arrangement 201 according to the disclosure with which embodiments of methods according to the disclosure may be executed will be described with reference to FIG. 4.

Figure 4:
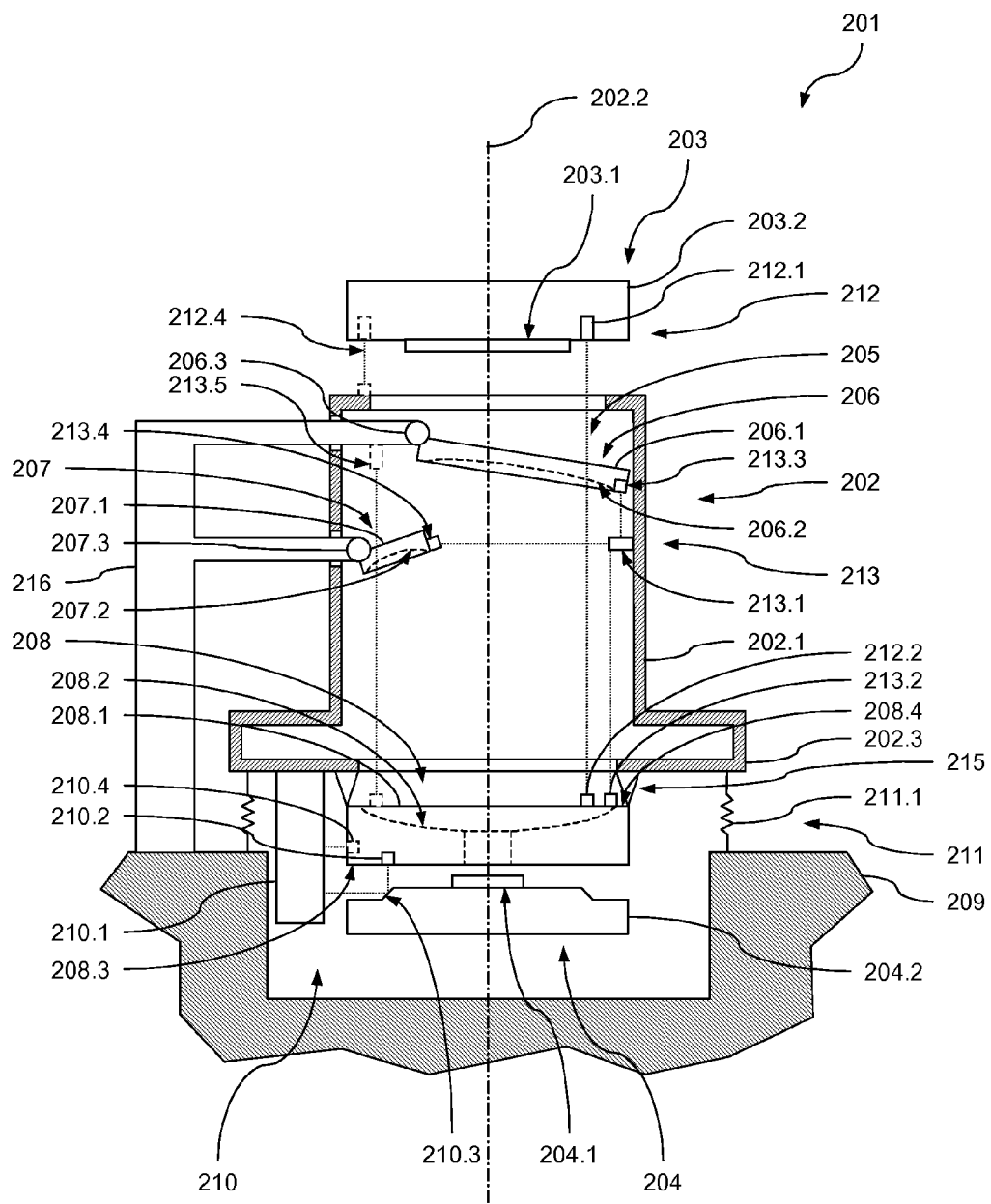
FIG. 4 is a schematic representation of an optical imaging arrangement according to the disclosure with which embodiments of the methods according to the disclosure may be executed.

FIG. 4, in its principal design and functionality, largely corresponds to FIG. 1. In particular, in FIG. 4, like or identical parts have been given the same reference numeral raised by 200.

Thus, it is here mainly referred to the explanations given above and, primarily, only the differences will be discussed.

FIG. 4 is a schematic and not-to-scale representation of the optical imaging arrangement in the form of an optical exposure apparatus 201 operating in the EUV range at a wavelength of 13 nm. The optical exposure apparatus 201 comprises an optical projection unit 202 adapted to transfer an image of a pattern formed on a mask 203.1 of a mask unit 203 onto a substrate 204.1 of a substrate unit 204. To this end, the optical exposure apparatus 201 comprises an illumination system—not shown—illuminating the reflective mask 203. The optical exposure unit 203 receives the light reflected from the mask 203.1 and projects the image of the pattern formed on the mask 203.1 onto the substrate 204.1, e.g. a wafer or the like.

To this end, the optical projection unit 202 holds an optical element unit group 205 of optical element units. The optical element unit group 205 comprises a number of optical elements in the form of mirrors, of which only the mirrors 206.1, 207.1, 208.1 are shown. These optical elements 208 are positioned with respect to one another along an axis 202.2 of the optical projection unit 202. The projection surfaces 206.2, 207.2, 208.2 of the optical elements 206.1, 207.1, 208.1 cooperate to transfer the image of the pattern formed on the mask 204 onto the substrate 205.

In order to keep predetermined limits of the relative position of the mirrors 206.1, 207.1, 208.1 with respect to each other as well as with respect to the mask 203.1 and the substrate 204.1, the mirrors 206.1 and 207.1 may be actively positioned in space (6 DOF) via actuator units 206.3 and 207.3, respectively. Similarly, the mask table 203.2 and the substrate table 204.2 may be actively positioned in space (6 DOF) via the respective support structure (not shown in FIG. 4). The active positioning of these parts is performed on the basis of the measurement results of the first to third metrology arrangement 210, 212 and 213 capturing (in 6 DOF) the spatial relationship between these components of the optical exposure apparatus 201.

One of the differences with respect to FIG. 1 lies within the fact that the first mirror 208.1 located closest to the substrate 204.1 is not located within the housing 202.1 of the optical projection unit 202. Instead, the first mirror 208.1 is suspended to the lower part of the housing 202.1 by a substantially rigid mounting device 215 providing support to the first mirror 208.1, e.g. at a resonant frequency of about 300 Hz or above.

As already explained in the context of the second embodiment, apart from the elimination of a conventional metrology frame, FIG. 4 has the advantage that, due to the substantially rigid suspension of the first mirror 208.1 outside the housing 202.1, building space becomes available in the region of the first mirror 208.1, since no housing elements are located at the circumference of the first mirror 208.1. Thus, the components of the first metrology arrangement 210 mounted to the housing 202.1 may be located closer to the first mirror 208.1 leading to improved dynamic behavior of these components.

A further difference with respect to FIG. 1 lies within the fact that the other mirrors 206.1 and 207.1 of the optical element unit group 205 are received within the housing 202.1 but supported separately by a support structure 216, referred to herein also as force frame 216. This support structure 216 is directly supported on the ground structure 209.

FIG. 4 has advantages with respect to the dynamic properties of the system. One is that the housing 202.1 is only dynamically connected to passive, not actuated parts such as the first mirror 208.1. Thus, the housing 202.1 is free of dynamic intrinsic loads or disturbances resulting from position adjustment actions on the mirrors 206.1 and 207.1 etc. Thus, the housing 202.1, herein also referred to as sensor frame, carrying parts of the first, second and third metrology arrangement 210, 212 and 213 is free of high frequency disturbances resulting from these position adjustment actions on the mirrors 206.1 and 207.1 leading to improved measurement results and less effort to achieve these results, respectively.

It will be appreciated that the mechanical disturbances introduced into the force frame 216 have to be accounted for by corresponding counteracting position adjustments via the actuator units 206.3 and 207.3 of the mirror units 206 and 207. However, to reduce these mechanical disturbances introduced into the force frame 216, the force frame 216 itself may be supported by a corresponding vibration isolation mechanism on the ground structure 209. Such a vibration isolation mechanism may support the force frame 216 at a resonant frequency comparable to the one of the vibration isolation device 211 chosen for the direct support of the sensor frame 202.1 on the ground structure 209. The resonant frequency of the vibration isolation mechanism of the force frame 216 may be chosen to be about 30 Hz or below.

As with the first and second embodiment, the first mirror 208.1 serves as the central reference in the entire system. Thus, in a design identical with the first and second embodiment, it integrates the first to third references 210.3, 212.3 and 213.3 of the first to third metrology arrangement 210, 212 and 213.

Here again, it will be appreciated that, with FIG. 4 as well, the methods according to the disclosure as they have been described above with reference to FIG. 2 may be executed as well. Thus, in this context, it is here only referred to the above explanations.

An optical imaging arrangement 301 according to the disclosure with which embodiments of methods according to the disclosure may be executed will be described with reference to FIG. 5.

Figure 5:
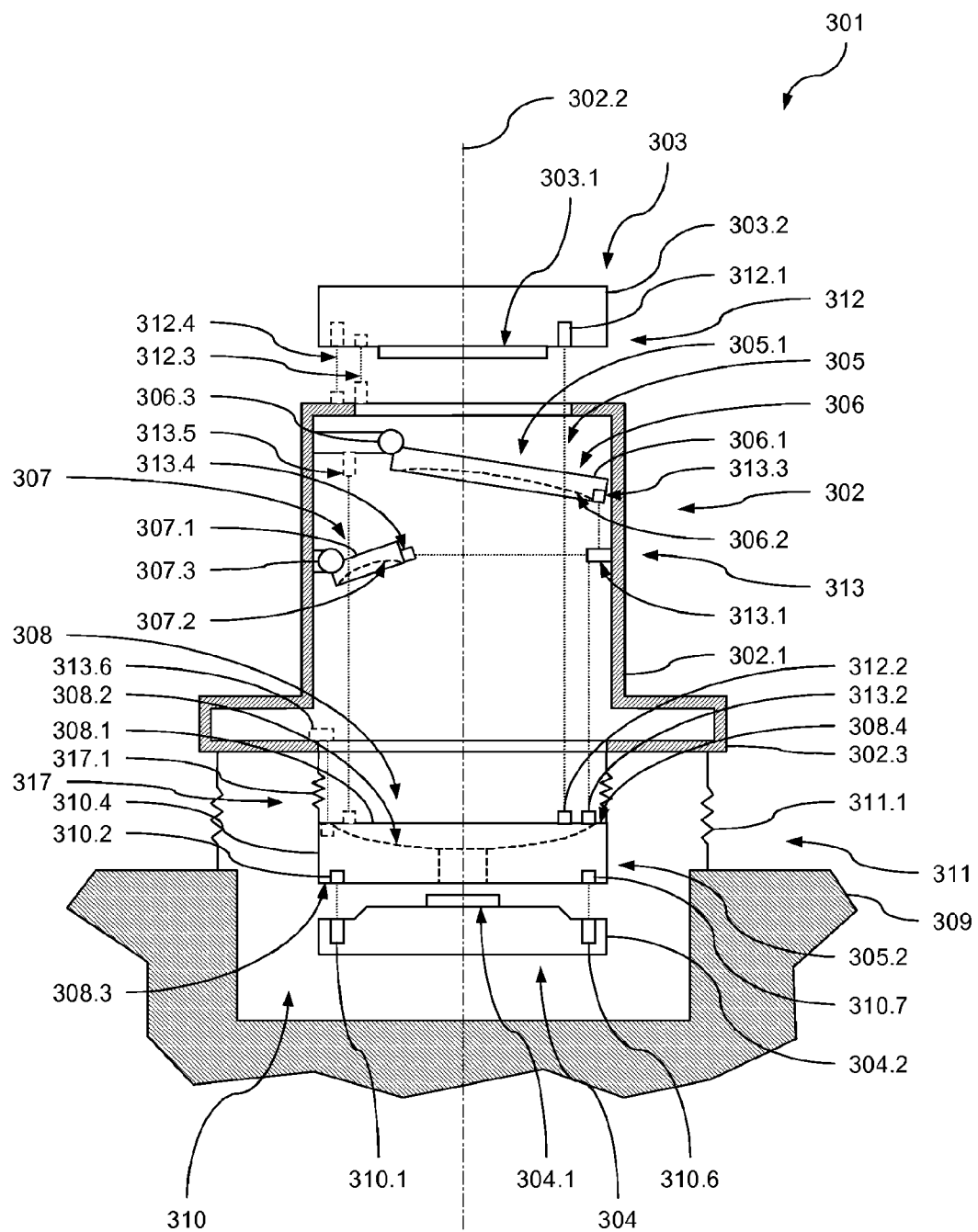
FIG. 5 is a schematic representation of an optical imaging arrangement according to the disclosure with which embodiments of the methods according to the disclosure may be executed.

FIG. 5, in its principal design and functionality, largely corresponds to FIG. 1. In particular, in FIG. 5, like or identical parts have been given the same reference numeral raised by 300. Thus, it is here mainly referred to the explanations given above and, primarily, only the differences will be discussed.

FIG. 5 is a schematic and not-to-scale representation of the optical imaging arrangement in the form of an optical exposure apparatus 301 operating in the EUV range at a wavelength of 13 nm. The optical exposure apparatus 301 comprises an optical projection unit 302 adapted to transfer an image of a pattern formed on a mask 303.1 of a mask unit 303 onto a substrate 304.1 of a substrate unit 304. To this end, the optical exposure apparatus 301 comprises an illumination system—not shown—illuminating the reflective mask 303. The optical exposure unit 303 receives the light reflected from the mask 303.1 and projects the image of the pattern formed on the mask 303.1 onto the substrate 304.1, e.g. a wafer or the like.

To this end, the optical projection unit 302 holds an optical element unit group 305 of optical element units. The optical element unit group 305 comprises a number of optical elements in the form of mirrors, of which only the mirrors 306.1, 307.1, 308.1 are shown. These optical elements 308 are positioned with respect to one another along an axis 302.2 of the optical projection unit 302. The projection surfaces 306.2, 307.2, 308.2 of the optical elements 306.1, 307.1, 308.1 cooperate to transfer the image of the pattern formed on the mask 304 onto the substrate 305.

The optical element unit group 305 comprises a first sub-group 305.1 and a second sub-group 305.2. The first sub-group 305.1 is held within a housing 302.1 of the optical projection unit 302, often also referred to as the projection optics box (POB) 302.1. The mirrors 306.1, 307.1 form part of the first sub-group 305.1, while the mirror 308.1 forms part of the second sub-group 305.2.

In order to keep predetermined limits of the relative position of the mirrors 306.1, 307.1, 308.1 with respect to each other as well as with respect to the mask 303.1 and the substrate 304.1, the mirrors 306.1 and 307.1 may be actively positioned in space (6 DOF) via actuator units 306.3 and 307.3, respectively. Similarly, the mask table 303.2 and the substrate table 304.2 may be actively positioned in space (6 DOF) via the respective support structure (not shown in FIG. 5). The active positioning of these parts is performed on the basis of the measurement results of the first to third metrology arrangement 310, 312 and 313 capturing (in 6 DOF) the spatial relationship between these components of the optical exposure apparatus 301.

One of the differences with respect to FIG. 1 lies within the fact that the first metrology arrangement 310 comprises two first emitter and receiver units 310.1 and 310.6 connected to the substrate table 304.2. The first metrology arrangement 310 further comprises two first reference elements 310.2 and 310.7 being mechanically connected directly to the first mirror 308.1, i.e. to the first imaging arrangement component.

Each of the first reference elements 310.2, 310.7 is connected to the back side surface 308.3 of the first mirror 308.1 opposite to the first reflective surface 308.2 of the first mirror 308.1. Depending on the working principle of the first metrology arrangement 310, the first reference element may be a reflecting element, e.g. a reflective surface or an element providing a plurality of reflecting surfaces such as a so called corner cube prism or the like, when an interferometry principle is used or a diffractive element, e.g. a grating, when an encoder principle is used. In FIG. 5, the reference element 310.2 is formed by the back side surface 308.3 of the first mirror 308.1. To this end, depending on the working principle of the first metrology arrangement 310, the back side surface 308.3 of the first mirror, at least in the region of the reference element 310.2, may be executed as a reflective surface or may show a grating, e.g. a grating directly exposed onto the back side surface 308.3.

However, it will be appreciated that, with other embodiments of the disclosure, one or each of the first reference elements may also be an element separate from the first mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

It will be appreciated that the measurement of the relative position between the first mirror 308.1 and the substrate table 304.2 in all six degrees of freedom may be made using one or more measurement beams provided by each of the first emitter and receiver units 310.1 and 310.6. In this case, for example, interferometry and encoder principles may be combined leading to a combination of reflective surfaces and gratings on the back side surface 308.3 of the first mirror 308.1. However, it will be appreciated that, with other embodiments of the disclosure, further reference elements located at other locations than the back side surface 308.3 of the first mirror may be used in the first metrology arrangement.

A further difference with respect to FIG. 1 lies within the fact that the first mirror 308.1 located closest to the substrate 304.1 is not located within the housing 302.1 of the optical projection unit 302. Instead, the first mirror 308.1 forming the second sub-group 305.2 is suspended to the lower part of the housing 302.1 in a vibration isolated manner via a second vibration isolating device 317. The second vibration isolating device 317, at its upper first end, directly contacts the housing 302.1. The second vibration isolating device 317, at its lower second end, directly contacts the first mirror 308.1.

The respective first and second vibration isolating device 311 and 317 is formed by a plurality of first and second vibration isolating units 311.1 and 317.1 evenly distributed at the circumference of the housing 302.1 and the first mirror 308.1, respectively. The frequency of the external mechanical disturbances introduced into the optical projection unit 302 via the ground structure 309 typically ranges between 30 Hz down to 1 Hz. Thus, depending on the frequency of the mechanical disturbances to be expected, the first and second vibration isolating units 311.1 and 317.1 may be of any suitable type providing a support to the housing 302.1 and the first mirror 308.1, respectively, at a resonant frequency of at least a factor 10 below the frequency of the mechanical disturbances to be expected.

Typically, the resonant frequency of the first and second vibration isolating units 311.1 and 317.1 will be chosen between 0.01 and 10 Hz. The resonant frequency of the support provided by the first and second vibration isolating units 311.1 and 317.1 can be at about 0.1 Hz or below. Such a vibration isolating unit 311.1 and 317.1, respectively, may be provided by well known so called magnetic gravity compensators having lateral drift control which may also operate according to an electromagnetic principle (e.g. using voice coil motors etc.) and may also provide the drift control at a resonant frequency of about the same order, such as about 0.1 Hz or below.

However, it will be appreciated that, with other embodiments of the disclosure, other working principles, e.g. purely mechanical working principles with spring arrangements of suitably low resonant frequency, may be chosen for the vibration isolating units.

As already explained in the context of the second embodiment, apart from the elimination of a conventional metrology frame, FIG. 5 has the advantage that, due to the suspension of the first mirror 308.1 outside the housing 302.1, building space becomes available in the region of the first mirror 308.1, since no housing elements are located at the circumference of the first mirror 308.1.

A further advantage of FIG. 5 results from the separate vibration isolated support of the first mirror 308.1. The first mirror 308.1, depending on the optical design of the optical system of the optical projection unit 302, typically, has a diameter of about 200 to 800 mm. In case the first mirror 308.1 is fabricated as a solid body of a suitable material such as Zerodur or the like, the first mirror 308.1 has a considerable mass, which, typically, may be as high as 60 kg and even beyond. The material of the first mirror 308.1, e.g. Zerodur or the like, may have a low coefficient of thermal expansion (CTE) and, thus, be thermally inert.

As mentioned, the first mirror 308.1 has a large mass, may be made of a thermally inert material, is not actively actuated and—as will be explained in further detail below—may integrate or hold only passive components of the metrology arrangements used in its context. Thus, the first mirror 308.1, in itself, is a—thermally and dynamically—highly stable component of the system. With the separate vibration isolated suspension, the first mirror 308.1 is dynamically decoupled from the part of the optical projection unit 302 held by the housing 302.1 and, thus, also stabilized with respect to external mechanical disturbances. Thus, it perfectly suits for the role as the central reference in the entire system that it is given according to FIG. 5 of the disclosure. Dynamically, the first mirror 308.1 is connected to the ground structure in a cascaded manner via two vibration isolation systems 311.1 and 317.1 in series, the latter arrangement offering extra isolation performance with respect to ground disturbances in particular.

According to this concept of providing the first mirror 308.1 as the central reference in the entire system, in a design identical with the first and second embodiment, the first mirror 308.1 holds and integrates, respectively, the first to third references 310.3, 312.3 and 313.3 of the first to third metrology arrangement 310, 312 and 313.

Here again, it will be appreciated that, with FIG. 5 as well, the methods according to the disclosure as they have been described above with reference to FIG. 2 may be executed as well. Thus, in this context, it is here only referred to the above explanations.

Furthermore, it will be appreciated that, with other embodiments of the disclosure, the second sub-group 305.2 of the optical element units may comprise further optical element units held together with the first optical element, here the first mirror 308.1, via the second vibration isolation device 317. To this end, this second subgroup may be received by a second housing structure or the like that is supported directly on the ground structure 309 via the second vibration isolating device 317.

An optical imaging arrangement 401 according to the disclosure with which embodiments of methods according to the disclosure may be executed will be described with reference to FIG. 6.

Figure 6:
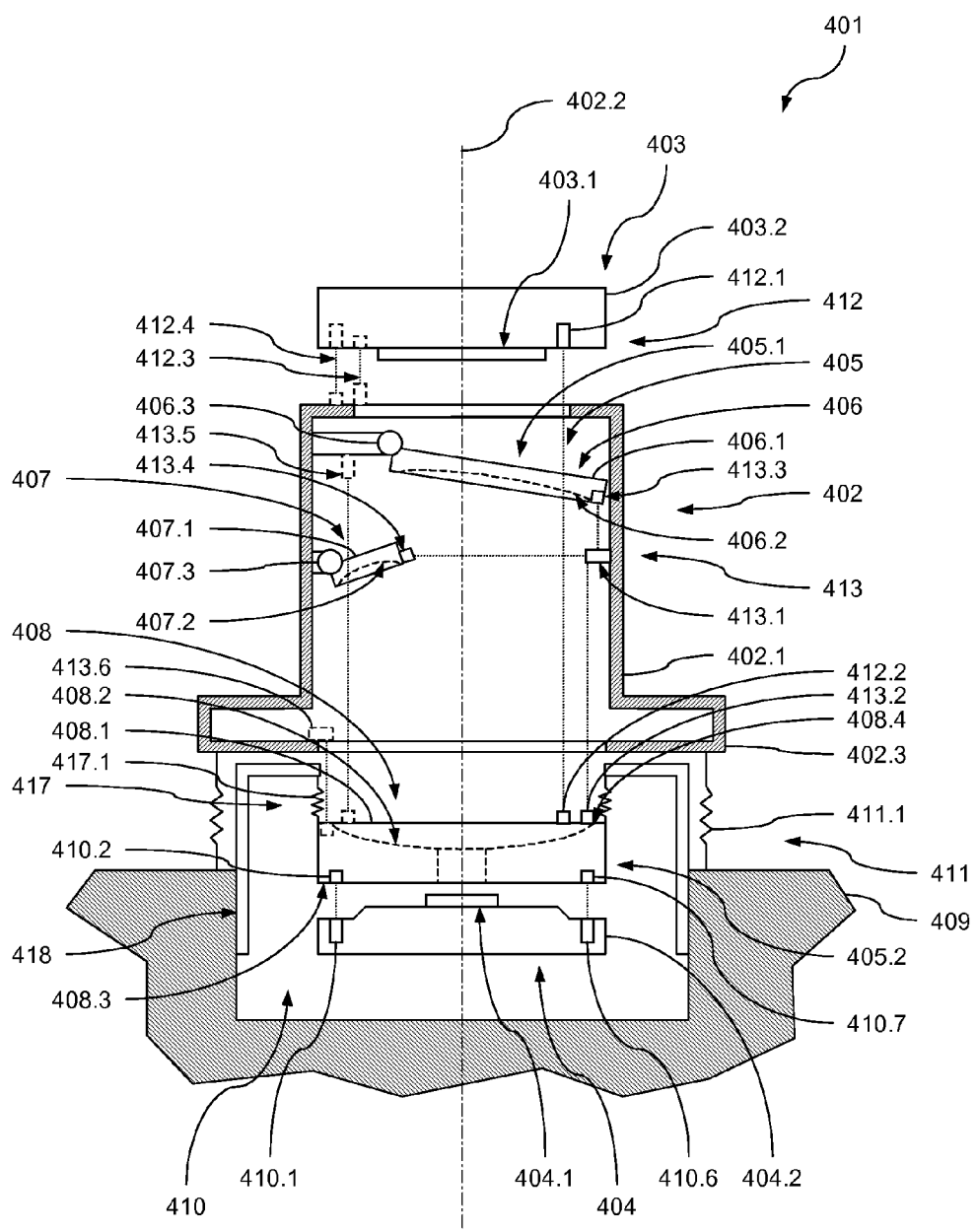
FIG. 6 is a schematic representation of an optical imaging arrangement according to the disclosure with which embodiments of the methods according to the disclosure may be executed.

FIG. 6, in its principal design and functionality, largely corresponds to FIG. 1. In particular, in FIG. 6, like or identical parts have been given the same reference numeral raised by 400.

FIG. 6 is a schematic and not-to-scale representation of the optical imaging arrangement in the form of an optical exposure apparatus 401 operating in the EUV range at a wavelength of 13 nm. The optical exposure apparatus 401 comprises an optical projection unit 402 adapted to transfer an image of a pattern formed on a mask 403.1 of a mask unit 403 onto a substrate 404.1 of a substrate unit 404. To this end, the optical exposure apparatus 401 comprises an illumination system—not shown—illuminating the reflective mask 403. The optical exposure unit 403 receives the light reflected from the mask 403.1 and projects the image of the pattern formed on the mask 403.1 onto the substrate 404.1, e.g. a wafer or the like.

To this end, the optical projection unit 402 holds an optical element unit group 405 of optical element units. This optical element unit group 405 comprises a first sub-group 405.1 and a second sub-group 405.2. The sub-group 405.1 is held within a housing 402.1 of the optical projection unit 402, often also referred to as the projection optics box (POB) 402.1.

The optical element unit group 405 comprises a number of optical elements in the form of mirrors, of which only the mirrors 406.1, 407.1, 408.1 are shown. These optical elements 408 are positioned with respect to one another along an axis 402.2 of the optical projection unit 402. The mirrors 406.1, 407.1 form part of the first sub-group 405.1, while the mirror 408.1 forms part of the second sub-group 405.2.

The optical projection unit 402 receives the part of the light path between the mask 403.1 and the substrate 404.1. The projection surfaces 406.2, 407.2, 408.2 of its optical elements 406.1, 407.1, 408.1 cooperate to transfer the image of the pattern formed on the mask 404 onto the substrate 405 located at the end of the light path.

The mask 403.1 is received on a mask table 403.2 of the mask unit 403, the mask table 403.2 being supported by a suitable support structure—not shown—on a ground structure 409. In a similar way, the substrate 404.1 is received on a substrate table 404.2 of the substrate unit 404, the substrate table 404.2 as well being supported by a suitable support structure—not shown—on the ground structure 409.

The image of the pattern formed on the mask 403.1 is usually reduced in size and transferred to several target areas of the substrate 404.1. The image of the pattern formed on the mask 403.1 may be transferred to the respective target area on the substrate 404.1 in two different ways depending on the design of the optical exposure apparatus 401. If the optical exposure apparatus 401 is designed as a so called wafer stepper apparatus, the entire image of the pattern is transferred to the respective target area on the substrate 404.1 in one single step by irradiating the entire pattern formed on the mask 403.1. If the optical exposure apparatus 401 is designed as a so called step-and-scan apparatus, the image of the pattern is transferred to the respective target area on the substrate 404.1 by progressively scanning the mask table 403.2 and thus the pattern formed on the mask 403.1 under the projection beam while performing a corresponding scanning movement of the substrate table 404.2 and, thus, of the substrate 404.1 at the same time.

In both cases, the relative position of the optical elements of optical element unit group 405, i.e. the mirrors 406.1, 407.1, 408.1, with respect to each other as well as with respect to the mask 403.1 and with respect to the substrate 404.1 has to be maintained within predetermined limits to obtain a high quality imaging result.

During operation of the optical exposure apparatus 401, the relative position of the mirrors 406.1, 407.1, 408.1 with respect to each other as well as with respect to the mask 403.1 and the substrate 404.1 is subject to alterations resulting from, both, intrinsic and extrinsic, disturbances introduced into the system. Such disturbances may be mechanical disturbances, e.g. in the form vibrations resulting from forces generated within the system itself but also introduced via the surroundings of the system, e.g. the ground structure 409. They may also thermally induced disturbances, e.g. position alterations due to thermal expansion of the parts of the system.

In order to keep the above predetermined limits of the relative position of the mirrors 406.1, 407.1, 408.1 with respect to each other as well as with respect to the mask 403.1 and the substrate 404.1, the mirrors 406.1 and 407.1 may be actively positioned in space via actuator units 406.3 and 407.3, respectively. Similarly, the mask table 403.2 and the substrate table 404.2 may be actively positioned in space via the respective support structure (not shown in FIG. 6).

The active positioning of these parts is performed on the basis of the measurement results of a plurality of metrology arrangements capturing the spatial relationship between certain components of the optical exposure apparatus 401.

A first metrology arrangement 410, in six degrees of freedom (DOF), captures the spatial relationship between a first imaging arrangement component of the optical exposure apparatus 401 and a second imaging arrangement component of the optical exposure apparatus 401 different from the first imaging arrangement component.

The first imaging arrangement component is a first optical element in the form of the first mirror 408.1 located closest to the substrate 404.1. Thus, the first imaging arrangement component is a component of the optical element unit 408. The second imaging arrangement component is the substrate table 404.2, i.e. a component of the substrate unit 404. Since the spatial relationship between the substrate table 404.2 and the substrate 404.1 is known, e.g. due to a measurement operation immediately preceding the exposure process, the first metrology arrangement 410 also allows to capture the spatial relationship between the substrate 404.1, as a component of the substrate unit 404, and the first mirror 408.1.

The first metrology arrangement 410 comprises two first emitter and receiver units 410.1 and 410.6 connected to the substrate table 404.2. The metrology arrangement 410 further comprises two first reference elements 410.2 and 410.7 being mechanically connected directly to the first mirror 408.1, i.e. to the first imaging arrangement component.

Each of the first reference elements 410.2, 410.7 is connected to the back side surface 408.3 of the first mirror 408.1 opposite to the first reflective surface 408.2 of the first mirror 408.1. Depending on the working principle of the first metrology arrangement 410, the first reference element may be a reflecting element, e.g. a reflective surface or an element providing a plurality of reflecting surfaces such as a so called corner cube prism or the like, when an interferometry principle is used or a diffractive element, e.g. a grating, when an encoder principle is used. In FIG. 6, the reference element 410.2 is formed by the back side surface 408.3 of the first mirror 408.1. To this end, depending on the working principle of the first metrology arrangement 410, the back side surface 408.3 of the first mirror, at least in the region of the reference element 410.2, may be executed as a reflective surface or may show a grating, e.g. a grating directly exposed onto the back side surface 408.3.

However, it will be appreciated that, with other embodiments of the disclosure, one or each of the first reference elements may also be an element separate from the first mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

It will be appreciated that the measurement of the relative position between the first mirror 408.1 and the substrate table 404.2 in all six degrees of freedom may be made using one or more measurement beams provided by each of the first emitter and receiver units 410.1 and 410.6. In this case, for example, interferometry and encoder principles may be combined leading to a combination of reflective surfaces and gratings on the back side surface 408.3 of the first mirror 408.1. However, it will be appreciated that, with other embodiments of the disclosure, further reference elements located at other locations than the back side surface 408.3 of the first mirror may be used in the first metrology arrangement.

Connection, more precisely integration, of part of the first metrology arrangement 410 with the first mirror 408.1 as well as connection, more precisely integration, of the remaining parts of the first metrology arrangement 410, in particular the first emitter and receiver unit 410.1 together with the well known X, Y, Z reference mirrors and the retro reflectors of the zero sensors, directly to the substrate table 404.2 allow to avoid the interposition of a large and bulky structure such as a metrology frame or the like between the ground structure 409 and the housing 402.1.

Thus, the metrology frame as it is used in conventional systems is omitted and the housing 402.1 of the optical projection unit 402 holding the first sub-group 405.1 of optical element units integrates functionality of such a metrology frame. The housing 402.1 is directly connected to the ground structure 409 in a vibration isolated manner via a first vibration isolating device 411. The first vibration isolating device 411, at its upper first end, directly contacts the housing 402.1 at a flange part 402.3 of the housing 402.1 and, at its lower second end, directly contacts the ground structure 409.

Furthermore, in this embodiment, the first mirror 408.1 forming the second sub-group 405.2 of optical element units is supported separately and also integrates functionality of such a metrology frame. The first mirror 408.1 is also directly connected to the ground structure 409 in a vibration isolated manner via a second vibration isolating device 417. The second vibration isolating device 417, at its upper first end, directly contacts a support structure 418 substantially rigidly mounted to the ground structure 409. The second vibration isolating device 417, at its lower second end, directly contacts the first mirror 408.1.

The respective first and second vibration isolating device 411 and 417 is formed by a plurality of first and second vibration isolating units 411.1 and 417.1 evenly distributed at the circumference of the housing 402.1 and the first mirror 408.1, respectively. The frequency of the external mechanical disturbances introduced into the optical projection unit 402 via the ground structure 409 typically ranges between 30 Hz down to 1 Hz. Thus, depending on the frequency of the mechanical disturbances to be expected, the first and second vibration isolating units 411.1 and 417.1 may be of any suitable type providing a support to the housing 402.1 and the first mirror 408.1, respectively, at a resonant frequency of at least a factor 10 below the frequency of the mechanical disturbances to be expected.

Typically, the resonant frequency of the first and second vibration isolating units 411.1 and 417.1 will be chosen between 0.01 and 10 Hz. The resonant frequency of the support provided by the first and second vibration isolating units 411.1 and 417.1 can be at about 0.1 Hz or below. Such a vibration isolating unit 411.1 and 417.1, respectively, may be provided by well known so called magnetic gravity compensators having lateral drift control which may also operate according to an electromagnetic principle (e.g. using voice coil motors etc.) and may also provide the drift control at a resonant frequency of about the same order, such as about 0.1 Hz or below.

However, it will be appreciated that, with other embodiments of the disclosure, other working principles, e.g. purely mechanical working principles with spring arrangements of suitably low resonant frequency, may be chosen for the vibration isolating units.

The elimination of the conventional metrology frame that may be achieved according to the disclosure provides a number of advantages over the optical projection systems currently known:

One advantage is that the elimination of the conventional metrology frame frees up a considerable amount of building space close to the substrate. This facilitates the design and dimensioning of the projection optics. A further advantage is that the housing 402.1 of the optical projection unit in itself has already to be highly stabilized in terms of thermal stability in order to reduce thermal drift effects between the optical elements received therein. Thus, the housing 402.1 is particularly suitable for integrating parts of the first metrology arrangement and the considerable effort usually necessary for thermal stabilization of a metrology frame has not to be taken. This considerably reduces the overall costs of the optical projection apparatus 1.

Further advantages of FIG. 6 lie within the separate vibration isolated support of the first mirror 408.1. The first mirror 408.1, depending on the optical design of the optical system of the optical projection unit 402, typically, has a diameter of about 200 to 800 mm. In case the first mirror 408.1 is fabricated as a solid body of a suitable material such as Zerodur or the like, the first mirror 408.1 has a considerable mass, which, typically, may be as high as 60 kg and even beyond. The material of the first mirror 408.1, e.g. Zerodur or the like, may have a low coefficient of thermal expansion (CTE) and, thus, be thermally inert.

One advantage is that the housing does not have to bear the load of the first mirror 408.1 and, thus, may be of less complicated optimized design. A second advantage is that a dynamic separation is achieved between the disturbances introduced into the first mirror 408.1 and the disturbances introduced into the housing 402.1. A third advantage lies within the fact that the first mirror 408.1 has a large mass, may be made of a thermally inert material, is not actively actuated and—as will be explained in further detail below—may integrate or hold only passive components of the metrology arrangements used in its context. Thus, the first mirror 408.1, in itself, is a—thermally and dynamically—highly stable component of the system. With the separate vibration isolated suspension, the first mirror 408.1 is dynamically decoupled from the rest of the optical projection unit 402 and, thus, also stabilized with respect to mechanical disturbances originating from the optical projection unit, e.g. from actuator forces for mirrors 306.2 and 307.2. Thus, it perfectly suits for the role as the central reference in the entire system that it is given according to FIG. 6 of the disclosure and as will be explained in the following.

According to the concept of providing the first mirror 408.1 as the central reference in the entire system, beyond the first metrology arrangement 410, a second metrology arrangement 412 is provided capturing the spatial relationship between the first mirror 408.1 and the mask table 403.2 in order to use the result in positional adjustment of the mask table 403.2 with respect to the optical projection system.

The second metrology arrangement 412 comprises a second emitter and receiver unit 412.1 connected to the mask table 403.2 and a second reference element 412.2 mechanically directly connected to the front side surface 408.4 of the first mirror 408.1. Here again, the second metrology arrangement 412 may capture, in 406 degrees of freedom (DOF), the spatial relationship between the first mirror 408.1 as a first imaging arrangement component of the optical exposure apparatus 401 and the mask table 403.2 as a second imaging arrangement component of the optical exposure apparatus 401.

The second reference element 412.2 is connected to the front side surface 408.3 of the first mirror 408.1 also forming the first reflective surface 408.2 of the first mirror 408.1. Depending on the working principle of the second metrology arrangement 412, the second reference element may be a reflecting element, e.g. a reflective surface or an element providing a plurality of reflecting surfaces such as a so called corner cube prism or the like, when an interferometry principle is used, or a diffractive element, e.g. a grating, when an encoder principle is used.

In FIG. 6, the front side surface 408.4 of the first mirror 408.1, depending on the working principle of the second metrology arrangement 412, at least in the region of the second reference element 412.2, may be executed as a reflective surface or may show a grating, e.g. a grating directly exposed onto the front side surface 408.4.

However, it will be appreciated that, with other embodiments of the disclosure, the second reference element may also be an element separate from the first mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

Furthermore, it will be appreciated that, with other embodiments of the disclosure, the second metrology arrangement 412 may be replaced by a conventional metrology arrangement as it is known from EP 1 182 509 A2 and as it is indicated in FIG. 6 by the dashed contour 412.3. Furthermore, the second metrology arrangement 412 may also be replaced by a metrology arrangement as it is indicated in FIG. 6 by the dashed contour 412.4. With such a second metrology arrangement the emitter and receiver unit is again connected to the mask table 403.2 and the second reference element is mechanically directly connected to the housing 402.1.

Finally, according to the concept of providing the first mirror 408.1 as the central reference in the entire system, beyond the first and second metrology arrangement 410 and 412, a third metrology arrangement 413 is provided capturing the spatial relationship between the first mirror 408.1 and the other mirrors 406.1 and 407.1 in order to use the result in the positional adjustment of the other mirrors 406.1 and 407.1 with respect to the first mirror 408.1.

The third metrology arrangement 413 comprises a third emitter and receiver unit 413.1 connected to the housing 402.1 and third reference elements 413.2, 413.3, 413.4 mechanically directly connected to surfaces of the mirrors 408.1, 406.1 and 407.1, respectively. Here again, the third metrology arrangement 413 may capture, in six degrees of freedom (DOF), the spatial relationship between the first mirror 408.1 as a first imaging arrangement component of the optical exposure apparatus 401 and the respective mirror 406.1 and 407.1 as a second imaging arrangement component of the optical exposure apparatus 401.

The third reference elements 413.2, 413.3, 413.4, depending on the working principle of the third metrology arrangement 413, may be reflecting elements, e.g. reflective surfaces or elements providing a plurality of reflecting surfaces such as so called corner cube prisms or the like, when an interferometry principle is used, or diffractive elements, e.g. gratings, when an encoder principle is used. In FIG. 6, the respective surfaces of the mirrors 408.1, 406.1 and 407.1 forming the third reference elements, depending on the working principle of the third metrology arrangement 413, at least in the region of the respective third reference element 413.2, 413.3, 413.4, may be executed as a reflective surface or may show a grating, e.g. a 2D grating.

However, it will be appreciated that, with other embodiments of the disclosure, the respective third reference element may also be an element separate from the respective mirror and mechanically connected directly thereto. For example, it may be a reflective surface or a grating etc. on a separate part that is connected via a positive connection, a frictional connection, an adhesive connection or any combination thereof directly to the first mirror. For example it may be screwed, clamped, adhesively or otherwise fixedly connected to the first mirror.

Furthermore, it will be appreciated that the respective measurement beam of the respective metrology arrangement does not necessarily have to have a straight course as it is shown in FIG. 6. Rather, depending on the design of the optical system, appropriate beam steering optics may be provided to guide the respective measurement beam, in a defined manner, on a non-straight track.

Furthermore, it will be appreciated that, with other embodiments of the disclosure, the third metrology arrangement 413 may be replaced by separate metrology arrangements as separately capturing the spatial relationship between the first mirror and the respective further mirror as it is indicated in FIG. 6 by the dashed contour 413.5 or capturing the spatial relationship between the first mirror and the housing as it is indicated in FIG. 6 by the dashed contour 413.6.

With FIG. 6, the first to third reference elements 410.2, 412.2, 413.2, 413.3, 413.4 have been provided directly on the respective optical element, i.e. mirrors 406.1, 407.1, 408.1. However, it will be appreciated that, with other embodiments of the disclosure, the respective reference elements may also be connected to other components of the respective optical element unit allowing for proper assessment of the spatial position of the respective optical element. For example, the respective reference element may also be connected to a optical element mounting holding the respective optical element and displaced together with the respective optical element.

It will be appreciated that, with the optical exposure apparatus 401 of FIG. 6, the method of transferring an image of a pattern onto a substrate according to the disclosure may be executed as it has described above with reference to FIG. 2.

Furthermore, it will be appreciated that, with other embodiments of the disclosure, the second sub-group 405.2 of the optical element units may comprise further optical element units held together with the first optical element, here the first mirror 408.1, via the second vibration isolation device 417. To this end, this second subgroup may be received by a second housing structure or the like that is supported directly on the ground structure 409 via the second vibration isolating device 417.

An optical imaging arrangement 501 according to the disclosure with which embodiments of methods according to the disclosure may be executed will be described with reference to FIG. 7.

Figure 7:
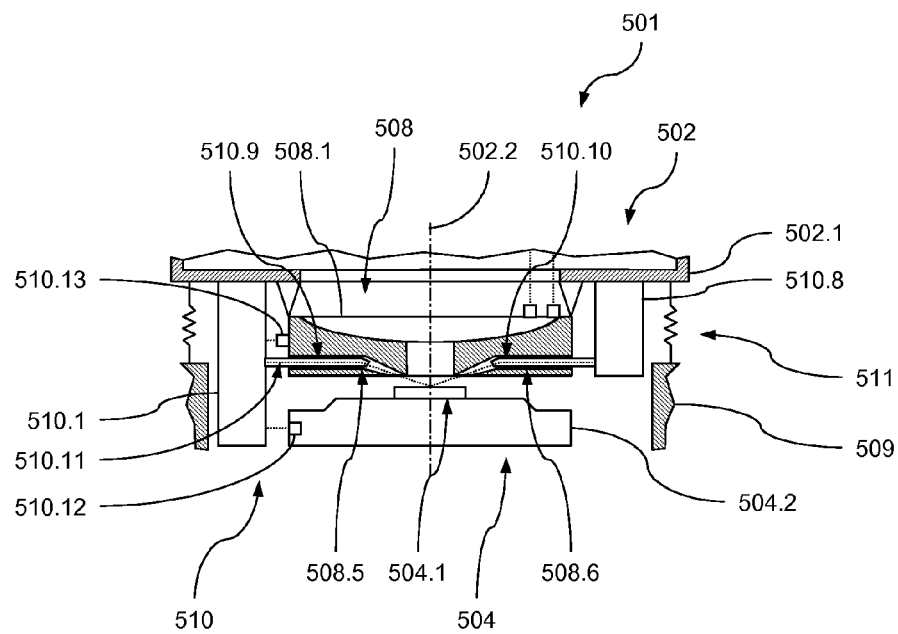
FIG. 7 is a schematic representation of an optical imaging arrangement according to the disclosure with which embodiments of the methods according to the disclosure may be executed.

FIG. 7, in its principal design and functionality, largely corresponds to FIG. 3. In particular, in FIG. 7, like or identical parts have been given the same reference numeral raised by 400 with respect to the ones from FIG. 3. The only difference between FIG. 7 and FIG. 3 lies within the design of the first metrology arrangement 510 and the design of the first mirror 508.1 of the optical element unit 508. All further parts are identical such that, in their respect, it is here referred to the above explanations given in the context of FIG. 3.

FIG. 7 is a schematic and not-to-scale partially sectional representation of the lower part of the optical imaging arrangement in the form of an optical exposure apparatus 501 operating in the EUV range at a wavelength of 13 nm. Here again, the housing 502.1 of the optical projection unit 502 integrates the function of a metrology frame and is directly connected to the ground structure 509 in a vibration isolated manner via a vibration isolating device 511 as it has been described above.

The first metrology arrangement 510, in six degrees of freedom (DOF), captures the spatial relationship between the first mirror 508.1 of the as a first imaging arrangement component of the optical exposure apparatus 501 and the substrate unit 504 as a second imaging arrangement component of the optical exposure apparatus 501 different from the first imaging arrangement component.

The first metrology arrangement 510 comprises an emitter and receiver unit 510.1 and a receiver unit 510.8 connected to the housing 502.1. The emitter and receiver unit 510.1 comprises a first beam steering unit 510.9 forming a metrology component of the first metrology arrangement 510. The first beam steering unit 510.9 is integrated within the first mirror 508.1. To this end, the first beam steering unit 510.9 is held within a first receptacle 508.5 formed by a first cavity within the first mirror 508.1. In order not to be influenced by any motions of the first mirror 508.1, the first beam steering unit 510.9 is held such that it does not contact the first mirror 508.1.

The receiver unit 510.8 comprises a second beam steering unit 510.10 forming a further metrology component of the first metrology arrangement 510. The second beam steering unit 510.10 is also integrated within the first mirror 508.1. To this end, the second beam steering unit 510.10 is held within a second receptacle 508.6 formed by a second cavity within the first mirror 508.1. In order not to be influenced by any motions of the first mirror 508.1, the second beam steering unit 510.10 is as well held such that it does not contact the first mirror 508.1.

It will be appreciated that the cavities for integrating the beam steering units may be achieved by any suitable mechanism. For example, corresponding cavities may be introduced into a solid mirror body. However, it will be appreciated that, with other embodiments of the disclosure, the mirror itself may be formed as structure that is internally at least partially hollow such that it is able to receive the beam steering units. Furthermore, it will be appreciated that, with other embodiments of the disclosure, instead of at least one of the beam steering units, an emitter and/or a receiver forming a respective metrology component of the first metrology arrangement may be held and thus integrated within the first mirror at a suitable location without contacting the mirror.

To provide the leveling information for the substrate table 504.2 along the axis 502.2, in a manner similar to known leveling systems, the emitter and receiver unit 510.1 emits a first measurement beam 510.11. This first measurement beam 510.11 is directed through the first mirror 508.1 via the first beam steering unit 510.9 and projected onto the substrate 504.1 at an oblique angle. The first measurement beam 510.11 is then reflected from the surface of the substrate 504.1 into the second beam steering unit 510.10. The second beam steering unit 510.10 guides the first measurement beam 510.11 to a receptor within the receiver unit 510.8. Depending on the position of the substrate table 504.2 along the axis 502.2, the first measurement beam 510.11 hits the receptor at a certain position. Thus, the position where the first measurement beam 510.11 hits the receptor provides the desired information about the position of the substrate table 504.2 along the axis 502.2 with respect to the housing 502.1.

The first metrology arrangement 510 further comprises two reference units 510.12 and 510.13. The reference unit 510.12 is mechanically connected directly to the substrate table 504.2 such that the first metrology arrangement 510 may provide, in the remaining degrees of freedom, the spatial relationship between the substrate table 504.2 and the first metrology arrangement 510. The reference unit 510.13 is mechanically connected directly to the first mirror 508.1 such that the first metrology arrangement 510 may provide, in six degrees of freedom, the spatial relationship between the first mirror 508.1 and the first metrology arrangement 510. Thus, the first metrology arrangement 510, in six degrees of freedom, may also provide the spatial relationship between the substrate table 504.2 and the first mirror 508.1 which is then used to position the substrate table 504.2 and, thus, the substrate 504.1 in space during the exposure process as it has been described above.

An optical imaging arrangement 601 according to the disclosure with which embodiments of methods according to the disclosure may be executed will be described with reference to FIGS. 8 and 9A to 9C.

Figure 8:
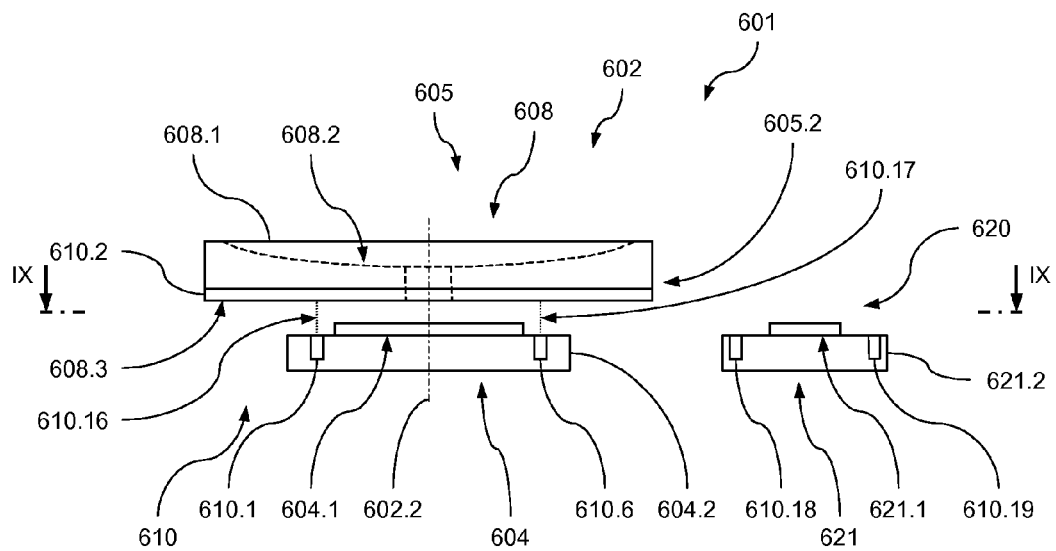
FIG. 8 is a schematic representation of a detail of an optical imaging arrangement according to the disclosure with which embodiments of the methods according to the disclosure may be executed.

FIG. 8, in its principal design and functionality, largely corresponds to FIG. 1. In particular, in FIG. 8, like or identical parts have been given the same reference numeral raised by 600. One difference between FIG. 8 and FIG. 1 lies within the design of the first metrology arrangement 610 and the design of the first mirror 608.1 of the optical element unit 608. A further difference with respect to FIG. 1 lies within the fact that the substrate unit 604 is part of a target unit 620 further comprising an image sensor unit 621. All further parts are identical such that, in their respect, it is here referred to the above explanations given in the context of FIG. 1.

FIG. 8 is a schematic and not-to-scale partially sectional representation of the lower part of the optical imaging arrangement in the form of an optical exposure apparatus 601 having an optical projection unit 602 with and optical element unit group 605 and operating in the EUV range at a wavelength of 13 nm.

The target unit 620 is designed to selectively place—by suitable mechanism not shown in FIG. 8—the substrate unit 604 and the image sensor unit 621 into an exposure position wherein they receive an image of the pattern formed on the mask that is transferred by the optical element group 605. In FIG. 8 the substrate unit 604 is shown in the exposure position.

The image sensor unit 621 comprises an image sensor 621.2 carried by an image sensor table 621.2. The image sensor 621.1 is designed for capturing an image of the pattern formed on the mask and providing corresponding signals to an evaluation unit—not shown in FIG. 8—evaluating the quality of the image captured.

In FIG. 8, the image sensor table 621.2 is a component that may be separately controlled. However, it will be appreciated that, with other embodiments of the disclosure, the substrate table and the image sensor table may be mechanically connected to form one single component.

During operation of the optical exposure apparatus 601, the relative position of the mirrors of the optical element unit group 605 with respect to each other as well as with respect to the mask and the substrate 604.1 is subject to alterations resulting from, both, intrinsic and extrinsic, disturbances introduced into the system as described above.

Independent of the operation of the optical exposure apparatus 601 as a wafer stepper apparatus or as a step-and-scan apparatus, the relative position of the optical elements of the optical element unit group 605 with respect to each other as well as with respect to the mask 603.1 and with respect to the substrate 604.1 has to be maintained within predetermined limits to obtain a high quality imaging result.

In order to keep the above predetermined limits of the relative position of the mirrors of the optical element unit group 605 with respect to each other as well as with respect to the mask and the substrate 604.1, among others, the first mirror 608.1 may be actively positioned in space via an actuator unit 608.7 (only schematically indicated in FIG. 9A) that is controlled by a control unit 619. Similarly, the mask table and the substrate table 604.2 may be actively positioned in space via the respective support structure (not shown in FIG. 8).

The active positioning of these parts is performed on the basis of the measurement results of a plurality of metrology arrangements, among others the first metrology arrangement 610, capturing the spatial relationship between certain components of the optical exposure apparatus 601. These metrology arrangements provide the position information that is captured to the control unit 619 which then controls actuation of the respective components.

The first metrology arrangement 610, in six degrees of freedom (DOF), captures the spatial relationship between the first mirror 608.1 of the optical element unit group 605 as a first imaging arrangement component of the optical exposure apparatus 601 and the substrate unit 604 as a second imaging arrangement component of the optical exposure apparatus 601 different from the first imaging arrangement component.

The first metrology arrangement 610 comprises an encoder arrangement with a first emitter and receiver unit 610.1 and three second emitter and receiver units 610.6, 610.14 and 610.15 mounted to the substrate table 604.2 and connected to a control unit 619. The encoder arrangement of the metrology arrangement 610 further comprises a first reference element 610.2 being mechanically connected directly to the first mirror 608.1, i.e. to the first imaging arrangement component.

Figure 9A:
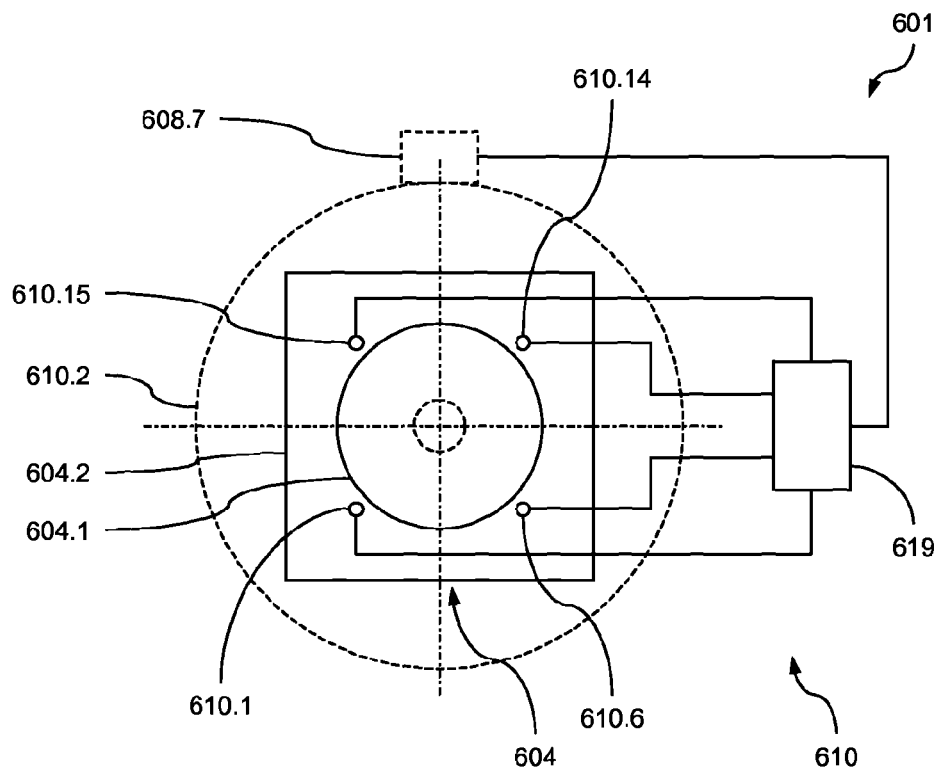
FIG. 9A is a schematic view onto plane IX-IX of FIG. 8 with the substrate unit in a first position.
Figure 9B:
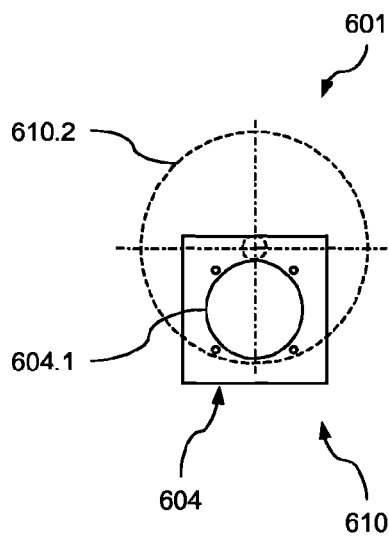
FIG. 9B is a schematic view onto plane IX-IX of FIG. 8 with the substrate unit in a second position.
Figure 9C:
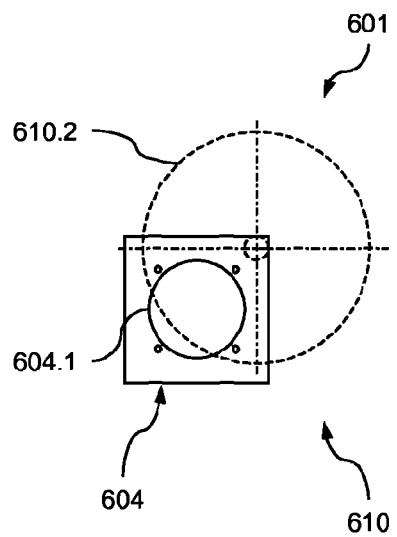
FIG. 9C is a schematic view onto plane IX-IX of FIG. 8 with the substrate unit in a third position.

The first reference element 610.2—the position of which is indicated in FIG. 9A to 9C by dashed lines—is connected to the back side surface 608.3 of the first mirror 608.1 opposite to the first reflective surface 608.2 of the first mirror 608.1. The first reference element is an encoder element in the form of a two-dimensional grating 610.2. In FIG. 8, the reference element 610.2 is formed by the back side surface 608.3 of the first mirror 608.1. To this end, the back side surface 608.3 of the first mirror, at least in the region of the reference element 610.2, shows a two-dimensional grating, e.g. a grating directly exposed onto the back side surface 608.3.

However, it will be appreciated that, with other embodiments of the disclosure, the first reference element may also be an element separate from the first mirror and mechanically connected directly thereto. For example, it may be a grating etc. on a separate part that is connected via an interlocking connection, a frictional connection, an adhesive connection or any combination thereof directly to the first mirror. For example it may be screwed, clamped, optically contacted, adhesively or otherwise fixedly connected to the first mirror.

Furthermore, it will be appreciated that a separate encoder element may be provided for each emitter and receiver unit or a subgroup of these emitter and receiver units. With individual encoder elements, in the centered position of the substrate table shown in FIG. 8, each emitter and receiver unit can be centered, i.e. aligned with the center of its associated encoder element.

Such a separate part can have a coefficient of thermal expansion that is adapted to the coefficient of thermal expansion of the first mirror. The coefficient of thermal expansion of the part where the grating can be formed on is as low as possible or the part is temperature controlled by suitable mechanism in order to avoid any distortion or deformation of the grating.

Each one of the first emitter and receiver unit 610.1 and the second emitter and receiver units 610.6, 610.14 and 610.15 of the encoder arrangement emits at least one light beam 610.16 and 610.17, respectively, towards the grating 610.2 and receives at least a part of the light beam 610.16 and 610.17, respectively, reflected back by the grating 610.2. When there is a relative movement between the grating and the respective emitter and receiver unit in a direction transverse to the respective light beam, the intensity of the light received at the emitter and receiver unit varies in a well known manner due to the structure of the grating leading to a correspondingly pulsed signal by the emitter and receiver unit. The control unit 619 uses these signals in a well known manner to draw conclusions on the relative movement.

The encoder arrangement, with the signals from the first emitter and receiver unit 610.1 and the second emitter and receiver units 610.6, 610.14 and 610.15, provides position information in at least three degrees of freedom, namely the two translational degrees of freedom (often referred to as translation along X-axis and Y-axis) in a plane perpendicular to the optical axis 602.2 of the optical projection unit 602 and the rotational degree of freedom (often referred to as rotation about Z-axis) about the optical axis 602.2.

It will be appreciated that the measurement of the relative position between the first mirror 608.1 and the substrate table 604.2 in all six degrees of freedom may be made using one or more measurement beams provided by each one of the first emitter and receiver unit 610.1 and the second emitter and receiver units 610.6, 610.14 and 610.15 610.6.

Furthermore, for example, the encoder principle of the encoder arrangement may be combined with interferometric and/or capacitive sensors to provide the position information in the remaining three degrees of freedom. In FIG. 8, this may be achieved with three measurements along the optical axis 602.2 (Z-axis). It will be appreciated that the grating 610.2 already provides a convenient reference element for this purpose. For example, capacitive sensors or interferometric sensors using diffraction patterns reflected off the grating 610.2 may be used.

However, it will be appreciated that, with other embodiments of the disclosure, further encoder elements located at other locations than the back side surface 608.3 of the first mirror may be used in the first metrology arrangement. Thus, for example, the entire metrology arrangement may operate according to the encoder principle.

The use of the encoder arrangement has several advantages. It is much easier to implement operate than known interferometric systems and provides more position information using less parts and less space. Furthermore, the encoder element, e.g. the grating is easier to manufacture than the high quality mirror surfaces required for known interferometric systems.

A further advantage of the use of the encoder arrangement is that a homing function may be easily implemented in a well known manner by incorporating into the grating 610.2, for example, multiple home index pulses in both translational degrees of freedom (X-axis and Y-axis). Thus, the substrate table 604.2 may be repeatedly driven to a known home position relative to the optical projection unit 602 without a need for complex initialization procedures. It will be appreciated that, to position the substrate table 604.2 in the capture range of the home index pulses, the positioning accuracy of the positioning unit of the substrate table 604.2 may be more than sufficient.

As mentioned above, connection, more precisely integration, of part of the first metrology arrangement 610 with the first mirror 608.1 as well as connection, more precisely integration, of the remaining parts of the first metrology arrangement 610, in particular the emitter and receiver units 610.1, 610.6, 610.14, 610.15, directly to the substrate table 604.2 makes it possible to eliminate large and bulky structures such as a metrology frame or the like between the ground structure and the housing of the optical projection unit 602 as it has been described above.

The emitter and receiver units 610.1, 610.6, 610.14, 610.15 are located close to and evenly distributed at the outer circumference of the substrate 604.1. They have a mutual distance that equals at least half of the maximum diameter of the substrate 604.1, thus reducing the maximum Abbe arm that may occur at extreme positions of the substrate table 604.2.

Thus, as can be seen from FIGS. 9B and 9C showing extreme positions of the substrate table 604.2, at least two, namely three, of these emitter and receiver units 610.1, 610.6, 610.14, 610.15 are functional to provide position information described above at any time in the range of relative motion between the optical projection unit 602 and the substrate unit 604. In other words, each of the emitter and receiver units 610.1, 610.6, 610.14, 610.15 is functional to provide position information in a part of the range of relative motion between the optical projection unit 602 and the substrate unit 604, these parts of the range of relative motion having an overlap such that three of these emitter and receiver units 610.1, 610.6, 610.14, 610.15 are functional to provide position information at any time.

It will be appreciated that, with other embodiments of the disclosure, another number of emitter and receiver units may be used. Even one single emitter and receiver unit may be used. However, optionally at least two, such as at least three emitter and receiver units, measuring at the same resolution in at least one common degree of freedom are used in order to avoid overly large encoder elements.

It will be appreciated that the four emitter and receiver units 610.1, 610.6, 610.14, 610.15 provide redundant position information that may be used, among others, by the control unit 619 for encoder calibration.

The first metrology arrangement 610 further comprises an encoder arrangement with a third emitter and receiver unit 610.18 and three fourth emitter and receiver units 610.19 mounted to the image sensor table 621.2 and also connected to the control unit 619. The third emitter and receiver unit 610.18 and the fourth emitter and receiver units 610.19 are arranged in a manner similar to the arrangement of the emitter and receiver units 610.1, 610.6, 610.14, 610.15 such that it is here only referred to the explanations given above.

The image sensor unit 621 is placed into the exposure position when the exposure process of the wafer 604.2 has been completed and a new wafer 604.2 has to be placed onto the wafer table 604.1 and, thus, the substrate unit 604 is removed from the exposure position. Of course it is also possible that the image sensor unit 621 is placed into the exposure position prior to placing the substrate unit 604 in the exposure position for the first time, i.e. prior to an exposure of a wafer 604.2.

When the image sensor unit 621 is placed in the exposure position, i.e. assumes the position of the substrate unit 604 shown in FIG. 8, the emitter and receiver units 610.18 and 610.19 cooperate with the first reference element 610.2 in a manner similar to the emitter and receiver units 610.1, 610.6, 610.14, 610.15 such that it is here also mainly referred to the explanations given above.

The encoder arrangement, with the signals from the third emitter and receiver unit 610.18 and the fourth emitter and receiver units 610.19, provides position information in at least three degrees of freedom, namely the two translational degrees of freedom (often referred to as translation along X-axis and Y-axis) in a plane perpendicular to the optical axis 602.2 of the optical projection unit 602 and the rotational degree of freedom (often referred to as rotation about Z-axis) about the optical axis 602.2. It will however be appreciated that, with other embodiments of the disclosure, any other suitable contactless or contact based working principle (as mentioned above) may be used for providing the position information in these at least three degrees of freedom.

As mentioned above, the signals provided by the image sensor 621.1 of the image sensor unit 621 may be used to evaluate the quality of the image captured. The data obtained therefrom may be used to Comprises an image sensor table 621.2 carrying an image sensor 621.1 designed for capturing an image of the pattern formed on the mask and providing corresponding signals to an evaluation unit—not shown in FIG. 8—evaluating the quality of the image captured. It will be appreciated that this image quality information provided by the image sensor 621.1 may be used, among others, by the control unit 619 for calibration and adjustment the components are the optical exposure apparatus 601.

It will be further appreciated that, with the optical exposure apparatus 601 of FIG. 8, the method of transferring an image of a pattern onto a substrate according to the disclosure may be executed as it has described above with reference to FIG. 2. The substrate thereby forms a first target device in the sense of the disclosure. Furthermore, with the optical exposure apparatus 601, this method described above with reference to FIG. 2 may also be used for transferring an image of a pattern onto the image sensor 621.1 forming a second target device in the sense of the disclosure.

It will be further appreciated that, with other embodiments of the disclosure, the respective emitter and receiver unit does not necessarily have to be mounted to the substrate unit. For example, the emitter and receiver unit may be executed as a separate emitter unit and a separate receiver unit. Either of such a emitter and receiver unit or separate emitter unit and receiver unit may be mounted external to the substrate unit. In such a case a beam directing device, e.g. a mirror, would be mounted to the substrate unit in order to direct the respective light beam to and from the encoder element.

It will be further appreciated that, with other embodiments of the disclosure, the encoder arrangement as described above may be used in combination with optical projection units comprising, partly or exclusively, other types of optical elements, such as refractive or diffractive optical elements. Furthermore, the encoder arrangement as described above may be used in combination with optical projection units working in other wavelength ranges.

Furthermore, the first imaging arrangement component does not necessarily have to be a component of an optical element unit. In particular with optical projection units not having such a large optical element close to the substrate, e.g. as it is the case with conventional refractive systems, the encoder element may also be formed or mounted on a part of the housing of the optical projection unit or even on a support structure supporting the optical projection unit. In particular, this may be the case where immersion techniques are used, i.e. where a part of the optical element located closest to the substrate unit is immersed, together with a part of the substrate, in an immersion medium such as highly purified water. In these cases, eventually, a separate sensor arrangement may be necessary to capture the relative position between the encoder element and an optical element the position of which is to be determined with respect to the substrate unit.

Furthermore, it will be appreciated that the first mirror 608.1, the substrate unit 604 and the first metrology arrangement 610 may replace the corresponding parts in embodiments described above.

It will be further appreciated that such an arrangement with a substrate unit as a first target unit and an image sensor unit as a second target unit may also be used in combination with embodiments described above.

Finally, it will be appreciated that a metrology arrangement comprising an encoder arrangement as described above in the context of FIG. 8 may also be used in conjunction with the positioning of the mask unit. A component of the mask unit would then be the first mirror 608.1, the substrate unit 604 and the first metrology arrangement 610 may replace the corresponding parts in embodiments described above.

Although, in the foregoing, embodiments of the disclosure have been described where the optical elements are exclusively reflective elements, it will be appreciated that, with other embodiments of the disclosure, reflective, refractive or diffractive elements or any combinations thereof may be used for the optical elements of the optical element units.

Furthermore, it will be appreciated that, with other embodiments of the disclosure, any other combination of the support concepts for the optical element sub-groups outlined above may be chosen.

What is claimed is:

1. An optical imaging arrangement comprising:
   a mask unit adapted to receive a pattern,
   a substrate unit adapted to receive a substrate;
   an optical projection unit comprising a group of optical element units comprising first and second optical element units, the optical projection unit being adapted to transfer an image of the pattern onto the substrate;
   a first imaging arrangement component, the first imaging arrangement component being a component of the first optical element unit,
   a second imaging arrangement component, the second imaging arrangement component being different from the first imaging arrangement component and the second imaging component being a component of the second optical element unit;
   a metrology arrangement;
   the metrology arrangement configured to capture a spatial relationship between the first imaging arrangement component and the second imaging arrangement component;
   the metrology arrangement comprising a reference structure;
   the metrology arrangement configured to capture a first spatial relationship between the first imaging arrangement component and the reference structure;
   the metrology arrangement configured to capture a second spatial relationship between the second imaging arrangement component and the reference structure; and
   the metrology arrangement configured to use the first and second spatial relationships to determine a spatial relationship between the first imaging arrangement component and the second imaging arrangement component.

2. The optical imaging arrangement according to claim 1, wherein the first imaging arrangement component is a component of the optical projection unit selected from the group consisting of a component located closest to the mask unit, a component located closest to the substrate unit, a large mass component, a large diameter component, a component supported in a vibration isolated manner, a component supported at a support resonant frequency from 3 Hz to 0.1 Hz, a component supported in a drift controlled manner, and a component supported separately from the second imaging arrangement component.

3. The optical imaging arrangement according to claim 1, wherein the first imaging arrangement component is an optical element.

4. The optical imaging arrangement according to claim 1, wherein the first imaging arrangement component is a mirror.

5. The optical imaging arrangement according to claim 1, wherein the metrology arrangement comprises a first reference element directly connected to the first imaging arrangement component, the metrology arrangement comprises a second reference element directly connected to the second imaging arrangement component, and at least one element selected from the group consisting of the first reference element and the second reference element comprises a reference surface, the reference surface being at least one of a reflective surface and a diffractive surface.

6. The optical imaging arrangement according to claim 5, wherein the reference surface is a surface of the first imaging arrangement component.

7. The optical imaging arrangement according to claim 5, wherein the optical projection unit comprises a group of optical elements, the optical elements have projection surfaces configured to cooperate in transferring the image of the pattern onto the substrate, and the reference surface is established on one of the projection surfaces, or the reference surface is on a surface of one of the optical elements other than one of the projection surfaces.

8. The optical imaging arrangement according to claim 1, wherein the optical projection unit comprises a group of optical elements, the optical elements have projection surfaces configured to cooperate in transferring the image of the pattern onto the substrate, the first imaging arrangement component is a mirror having a front part with a reflective front surface and a rear part, the reflective front surface is one of the projection surfaces, and at least a part of the reference element being connected to the rear part.

9. The optical imaging arrangement according to claim 8, wherein the rear part is a rear surface opposite to the front surface, the reference element comprises a reference surface, the reference surface being at least one of a reflective surface and a diffractive surface, and at least a part of the rear surface forms at least a part of the reference surface.

10. The optical imaging arrangement according to claim 1, wherein the optical projection unit exclusively comprises reflective optical elements having reflective projection surfaces cooperating in transferring the image of the pattern onto the substrate, and the first imaging arrangement component is one of the reflective optical elements.

11. The optical imaging arrangement according to claim 1, wherein the second imaging arrangement component is an optical element.

12. The optical imaging arrangement according to claim 1, further comprising a first vibration isolating device having a first end and a second end, the first end of the first vibration isolating device directly contacts the reference structure, and the second end of the first vibration isolating device directly contacts a ground structure.

13. The optical imaging arrangement according to claim 12, wherein the first vibration isolating device has a resonant frequency between 0.01 Hz and 10 Hz.

14. The optical imaging arrangement according to claim 12, wherein the reference structure supports at least a part of the metrology arrangement.

15. The optical imaging arrangement according to claim 12, wherein the first imaging arrangement component is supported by the reference structure at a location external to the reference structure.

16. The optical imaging arrangement according to claim 12, wherein the first imaging arrangement component is supported via a second vibration isolating device.

17. The optical imaging arrangement according to claim 16, wherein the second vibration isolating device has a first end and a second end, the first end of the first vibration isolating device directly contacts the first imaging arrangement component, and the second end of the first vibration isolating device directly contacts one of the reference structure and the ground structure.

18. The optical imaging arrangement according to claim 16, wherein the second vibration isolating device has a resonant frequency between 0.01 Hz and 10 Hz.

19. The optical imaging arrangement according to claim 16, wherein the optical projection unit comprises a support structure, the support structure supports a second sub-group of the optical element units, and the second sub-group comprises the first imaging arrangement component.

20. The optical imaging arrangement according to claim 19, wherein the second vibration isolating device has a first end and a second end, the first end of the second vibration isolating device directly contacting the support structure, and the second end of the second vibration isolating device directly contacting one of the reference structure and the ground structure.

21. The optical imaging arrangement according to claim 1, wherein the optical projection unit comprises a first support unit supporting a sub-group of the optical element units, a second support unit supports the first imaging arrangement component, a vibration isolating device has a first end and a second end, the first end of the vibration isolating device directly contacts the second support unit, and the second end of the vibration isolating device directly contacts a ground structure.

22. The optical imaging arrangement according to claim 21, wherein the first vibration isolating device has a resonant frequency between 0.01 Hz and 10 Hz.

23. The optical imaging arrangement according to claim 21, wherein the second support unit supports at least a part of the metrology arrangement.

24. The optical imaging arrangement according to claim 21, wherein the second support unit forms a housing receiving the sub-group of the optical element units.

25. The optical imaging arrangement according to claim 1, further comprising a control unit connected to the metrology arrangement to receive the spatial relationship between the first imaging arrangement component forming a central reference and the second imaging arrangement component,
wherein the control unit is configured to control, in up to six degrees of freedom and as a function of the spatial relationship received from the metrology arrangement, a position assumed, during transfer of the image of the pattern onto the substrate, by the second imaging arrangement component with respect to the first imaging arrangement component.

26. The optical imaging arrangement according to claim 1, wherein the mask unit and the optical projection unit are adapted to use light in the EUV range.

27. The optical imaging arrangement according to claim 1, further comprising a third imaging arrangement component,
wherein the third imaging arrangement component is a component of the mask unit or the substrate unit, the metrology arrangement is configured to capture a third spatial relationship between the third imaging arrangement component and the reference structure, and the metrology arrangement is configured to use the first spatial relationship and the third spatial relationship to determine a further spatial relationship between the first imaging arrangement component and the third imaging arrangement component.

28. The optical imaging arrangement according to claim 27, further comprising a control unit connected to the metrology arrangement to receive the further spatial relationship between the first imaging arrangement component forming a central reference and the third imaging arrangement component,
wherein the control unit is configured to control, in up to six degrees of freedom and as a function of the spatial relationship received from the metrology arrangement, a position assumed, during transfer of the image of the pattern onto the substrate, by the third imaging arrangement component with respect to the first imaging arrangement component.

29. A method, comprising:
providing an optical imaging arrangement comprising a mask unit comprising a pattern, a substrate unit comprising a substrate, an optical projection unit comprising a group of optical element units, the optical projection unit being adapted to transfer an image of the pattern onto the substrate, a first imaging arrangement component, the first imaging arrangement component being a component of a first optical element unit, and a second imaging arrangement component, the second imaging arrangement component being different from the first imaging arrangement component, the second imaging arrangement being a component of the optical projection unit;
capturing a first spatial relationship between the first imaging arrangement component and a reference structure;
capturing a second spatial relationship between the second imaging arrangement component and the reference structure;
using the first and second spatial relationships to determine a spatial relationship between the first imaging arrangement component and the second imaging arrangement component; and
controlling, in up to six degrees of freedom and as a function of the spatial relationship received from the metrology arrangement, a position that the second imaging arrangement component assumes, during transfer of the image of the pattern onto the substrate, with respect to the first imaging arrangement component forming a central reference.

30. The method according to claim 29, wherein the first imaging arrangement component group is a component of the optical projection unit selected from the group consisting of a component located closest to the mask unit, a component located closest to the substrate unit, a large mass component, a large diameter component, a component supported in a vibration isolated manner, a component supported at a support resonant frequency from 3 Hz to 0.1 Hz, a component supported in a drift controlled manner, and a component supported separately from the second imaging arrangement component.

31. The method according to claim 29, wherein the first imaging arrangement component is a mirror.

32. The method according to claim 29, wherein the reference element comprises a reference surface which is a surface of the first imaging arrangement component.

33. The method according to claim 29, further comprising:
capturing a third spatial relationship between a third imaging arrangement component and the reference structure, the third imaging arrangement component being a component of one of the mask unit and the substrate unit;
using the first spatial relationship and the third spatial relationship to determine a further spatial relationship between the first imaging arrangement component forming a central reference and the third imaging arrangement component; and
controlling, in up to six degrees of freedom and as a function of the further spatial relationship, a position that the third imaging arrangement component assumes, during transfer of the image of the pattern onto the substrate, with respect to the first imaging arrangement component.

* * * * *

UNITED STATES PATENT AND TRADEMARK OFFICE
CERTIFICATE OF CORRECTION

| | |
|---|---|
| PATENT NO. | : 8,416,392 B2 |
| APPLICATION NO. | : 12/883639 |
| DATED | : April 9, 2013 |
| INVENTOR(S) | : Kwan |

It is certified that error appears in the above-identified patent and that said Letters Patent is hereby corrected as shown below:

In the Specification

Column 2, Line 4: delete "to" and insert --too--.

Column 30, Line 16: delete "610.15 610.6." and insert --610.15.--.

In the Claims

Column 33, Line 24, Claim 1: delete "component" and insert --component,--.

Signed and Sealed this
Twenty-ninth Day of October, 2013

Teresa Stanek Rea
*Deputy Director of the United States Patent and Trademark Office*